(12) United States Patent
Sawaguchi et al.

(10) Patent No.: US 12,308,813 B2
(45) Date of Patent: May 20, 2025

(54) FILTER CIRCUIT AND MULTILAYERED FILTER DEVICE

(71) Applicant: TDK CORPORATION, Tokyo (JP)

(72) Inventors: Shuhei Sawaguchi, Tokyo (JP); Masahiro Tatematsu, Tokyo (JP); Yuta Ashida, Tokyo (JP); Tetsuzo Goto, Tokyo (JP); Yoshinori Matsumaru, Tokyo (JP); Shigemitsu Tomaki, Tokyo (JP); Longfei Yi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 284 days.

(21) Appl. No.: 18/161,286

(22) Filed: Jan. 30, 2023

(65) Prior Publication Data

US 2023/0246621 A1   Aug. 3, 2023

(30) Foreign Application Priority Data

Feb. 3, 2022   (JP) .................................. 2022-015577

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01F 27/29* (2013.01); *H01F 27/40* (2013.01); *H01G 4/01* (2013.01); *H01G 4/30* (2013.01); *H03H 7/0161* (2013.01); *H01F 2027/2809* (2013.01)

(58) Field of Classification Search
CPC ......... H03H 2001/0085; H03H 7/0115; H03H 7/1775; H03H 7/1708; H03H 7/1766; H03H 7/0161; H03H 7/09; H03H 7/1758; H03H 7/42; H03H 7/0123; H03H 7/075; H03H 9/0028; H01F 2017/0026; H01F 2027/2809; H01F 27/2804; H01F 17/0013; H01F 27/40; H01F 2017/002; H01F 2017/004; H01F 27/29; H01G 4/30; H01G 4/40; H01G 4/012; H01G 4/232
See application file for complete search history.

(56) References Cited

U.S. PATENT DOCUMENTS 11,476,822 B2 * 10/2022 Sawaguchi ............. H03H 7/42
2004/0248542 A1 * 12/2004 Heuermann ......... H03H 9/0095
455/213

FOREIGN PATENT DOCUMENTS

JP   2002-374139 A   12/2002

OTHER PUBLICATIONS

Dey, Utpal, Julio Gonzalez Marin, and Jan Hesselbarth. "Low-Loss and Tunable Millimeter-Wave Filters Using Spherical Dielectric Resonators." International journal of microwave and wireless technologies 13.8 (2021): 751-755. Web. (Year: 2021).*

* cited by examiner

*Primary Examiner* — Lincoln D Donovan
*Assistant Examiner* — Tyler J Pereny
(74) *Attorney, Agent, or Firm* — Oliff PLC

(57) ABSTRACT

A filter circuit includes a pair of balanced input ports, a pair of balanced output ports, and first and second resonators provided in parallel between the pair of balanced input ports and the pair of balanced output ports in a circuit configuration, the first and second resonators being magnetically coupled to each other. Between the first resonator and the second resonator, a capacitor is present but no inductor is present in the circuit configuration.

20 Claims, 15 Drawing Sheets

(51) Int. Cl.
*H01F 27/29* (2006.01)
*H01F 27/40* (2006.01)
*H01G 4/01* (2006.01)
*H01G 4/30* (2006.01)

FILTER CIRCUIT AND MULTILAYERED FILTER DEVICE

CROSS REFERENCE TO RELATED APPLICATIONS

This application claims the benefit of Japanese Priority Patent Application No. 2022-015577 filed on Feb. 3, 2022, the entire contents of which are incorporated herein by reference.

BACKGROUND OF THE INVENTION

1. Field of the Invention

The present invention relates to a balanced filter circuit and a multilayered filter device including the balanced filter circuit.

2. Description of the Related Art

One of electronic components used in a communication apparatus is a band-pass filter including a plurality of resonators. Each of the plurality of resonators includes, for example, an inductor and a capacitor. As the band-pass filter, a balanced band-pass filter including a pair of balanced output ports is known. The balanced band-pass filter includes a band-pass filter including one unbalanced input port and a band-pass filter including a pair of balanced input ports.

JP 2002-374139 A discloses a balanced LC filter including a pair of balanced input terminals and a pair of balanced output terminals. In the balanced LC filter, two LC resonators are electrically connected to each other via a pair of coupling coils.

In general, the balanced band-pass filter such as the balanced LC filter disclosed in JP 2002-374139 A has a symmetrical circuit configuration. Thus, in the balanced band-pass filter, the number of elements tends to increase, which makes it difficult to downsize the band-pass filter.

The above problem applies generally to balanced filter circuits, not only to the balanced band-pass filters.

SUMMARY OF THE INVENTION

An object of the present invention is to provide a balanced filter circuit that can be downsized, and a balanced multilayered filter device that can be downsized.

A filter circuit according to the present invention includes a pair of balanced input ports, a pair of balanced output ports, and a first resonator and a second resonator provided in parallel between the pair of balanced input ports and the pair of balanced output ports in a circuit configuration, the first resonator and the second resonator being magnetically coupled to each other. Between the first resonator and the second resonator, a capacitor is present but no inductor is present in the circuit configuration.

The filter circuit according to the present invention may further include a first capacitor provided in a path connecting one end of the first resonator and one end of the second resonator, and a second capacitor provided in a path connecting another end of the first resonator and another end of the second resonator.

The filter circuit according to the present invention may further include a third resonator provided in parallel to the first resonator, between the pair of balanced input ports and the first resonator in the circuit configuration.

The filter circuit according to the present invention may further include a fourth resonator provided in parallel to the second resonator, between the pair of balanced output ports and the second resonator in the circuit configuration.

The filter circuit according to the present invention may further include two input inductors electrically connected to the pair of balanced input ports.

The filter circuit according to the present invention may further include two output inductors electrically connected to the pair of balanced output ports.

The filter circuit according to the present invention may have the circuit configuration in which a part including the pair of balanced input ports and the first resonator in the circuit configuration and a part including the pair of balanced output ports and the second resonator in the circuit configuration are configured to be symmetrical with respect to a center between the first resonator and the second resonator.

The filter circuit according to the present invention may have the circuit configuration in which a part including one port of the pair of balanced input ports and one port of the pair of balanced output ports in the circuit configuration and a part including another port of the pair of balanced input ports and another port of the pair of balanced output ports in the circuit configuration are configured to be symmetrical with respect to the first resonator and the second resonator.

A multilayered filter device according to the present invention includes a pair of balanced input terminals, a pair of balanced output terminals, a first resonator and a second resonator provided in parallel between the pair of balanced input terminals and the pair of balanced output terminals in a circuit configuration, the first resonator and the second resonator being magnetically coupled to each other, and a stack for integrating the pair of balanced input terminals, the pair of balanced output terminals, and the first resonator and the second resonator, the stack including a plurality of dielectric layers stacked together. The first resonator includes a first inductor wound around a first axis. The second resonator includes a second inductor wound around a second axis. An opening of the first inductor and an opening of the second inductor face each other.

In the multilayered filter device according to the present invention, each of the first inductor and the second inductor may include a first through hole line, a second through hole line, and a conductor layer connecting the first through hole line and the second through hole line. Each of the first through hole line and the second through hole line may be formed with two or more through holes being connected in series.

The multilayered filter device according to the present invention may further include a third resonator provided in parallel to the first resonator, between the pair of balanced input terminals and the first resonator in the circuit configuration. The third resonator may include a third inductor wound around a third axis. An opening of the third inductor may not overlap the opening of the first inductor when seen in a direction parallel to the third axis.

The multilayered filter device according to the present invention may further include a fourth resonator provided in parallel to the second resonator, between the pair of balanced output terminals and the second resonator in the circuit configuration. The fourth resonator may include a fourth inductor wound around a fourth axis. An opening of the fourth inductor may not overlap the opening of the second inductor when seen in a direction parallel to the fourth axis.

The multilayered filter device according to the present invention may further include two input inductors electrically connected to the pair of balanced input terminals. Each of the two input inductors may be wound around an axis extending in a direction different from a direction of the first axis. The two input inductors may be wound around axes extending in directions different from each other.

The multilayered filter device according to the present invention may further include two output inductors electrically connected to the pair of balanced output terminals. Each of the two output inductors may be wound around an axis extending in a direction different from a direction of the second axis. The two output inductors may be wound around axes extending in directions different from each other.

In the multilayered filter device according to the present invention, a shape and an arrangement of a plurality of conductors constituting a part including the pair of balanced input terminals and the first resonator in the stack may be symmetrical with a shape and an arrangement of a plurality of conductors constituting a part including the pair of balanced output terminals and the second resonator in the stack, with respect to a first imaginary plane passing between the first inductor and the second inductor and being parallel to a stacking direction of the plurality of dielectric layers.

In the multilayered filter device according to the present invention, a shape and an arrangement of a plurality of conductors constituting a part including one terminal of the pair of balanced input terminals and one terminal of the pair of balanced output terminals in the stack may be symmetrical with a shape and an arrangement of a plurality of conductors constituting a part including another terminal of the pair of balanced input terminals and another terminal of the pair of balanced output terminals in the stack with respect to a second imaginary plane crossing the first inductor and the second inductor and being parallel to a stacking direction of the plurality of dielectric layers.

In the filter circuit according to the present invention, between the first resonator and the second resonator, a capacitor is present but no inductor is present in the circuit configuration. With this, according to the present invention, the balanced filter circuit that can be downsized can be implemented.

In the multilayered filter device according to the present invention, an opening of the first inductor and an opening of the second inductor face each other. With this, according to the present invention, the balanced multilayered filter device that can be downsized can be implemented.

Other and further objects, features and advantages of the present invention will appear more fully from the following description.

DETAILED DESCRIPTION OF THE PREFERRED EMBODIMENTS

Figure 1:
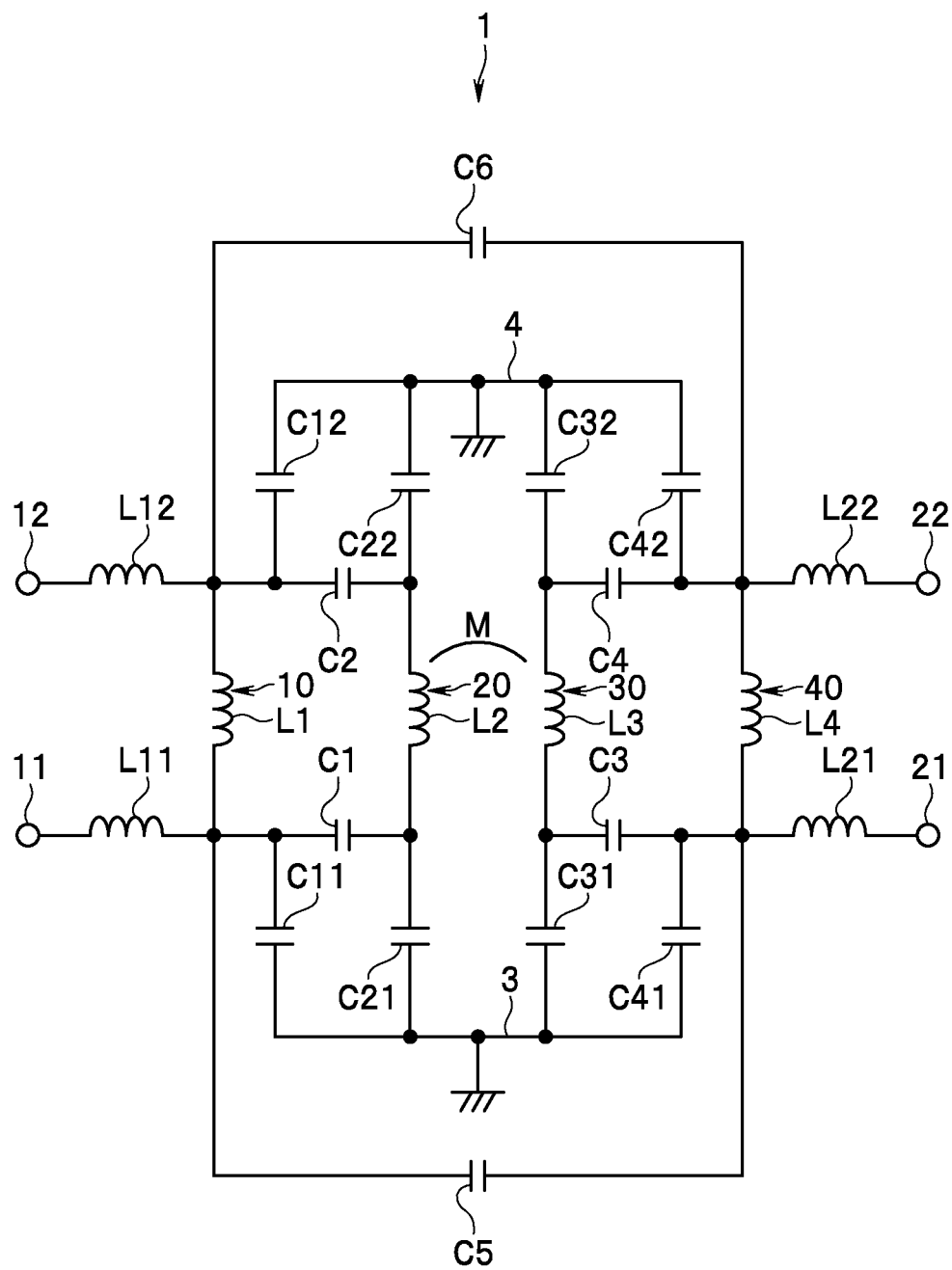
FIG. 1 is a circuit diagram showing a circuit configuration of a filter circuit according to an embodiment of the present invention.

An embodiment of the present invention will be described below in detail with reference to the drawings. First, with reference to FIG. 1, a configuration of a filter circuit 1 according to an embodiment of the present invention will be described. FIG. 1 is a circuit diagram showing a circuit configuration of the filter circuit 1. The filter circuit 1 is configured to function as a balanced band-pass filter that selectively allows a balanced signal of a frequency in a predetermined passband to pass.

The filter circuit 1 according to the present embodiment includes a pair of balanced input ports 11 and 12, a pair of balanced output ports 21 and 22, and a resonator 10, a resonator 20, a resonator 30, and a resonator 40 provided between the pair of balanced input ports 11 and 12 and the pair of balanced output ports 21 and 22 in the circuit configuration. The resonators 10, 20, 30, and 40 may each be a half wavelength resonator. Note that, in the present application, the expression "in the (a) circuit configuration" is used not to indicate a layout in a physical configuration but to indicate a layout in a circuit diagram.

In the filter circuit 1, a first balanced element signal is input to the balanced input port 11, and a second balanced element signal is input to the balanced input port 12. The first balanced element signal and the second balanced element signal constitute a balanced input signal. In the filter circuit 1, a third balanced element signal is output from the balanced output port 21, and a fourth balanced element signal is output from the balanced output port 22. The third balanced element signal and the fourth balanced element signal constitute a balanced output signal.

The resonators 20 and 30 are provided in parallel between the pair of balanced input ports 11 and 12 and the pair of balanced output ports 21 and 22 in the circuit configuration. The resonators 20 and 30 are magnetically coupled to each other. In FIG. 1, a curve denoted by a symbol M represents magnetic coupling between the resonators 20 and 30. The resonator 20 corresponds to a "first resonator" in the present invention. The resonator 30 corresponds to a "second resonator" in the present invention.

As shown in FIG. 1, between the resonator 20 and the resonator 30, capacitors are present but no inductors are present in the circuit configuration. In the present embodiment in particular, the filter circuit 1 further includes two capacitors C21 and C31 provided in a path 3 connecting one end of the resonator 20 and one end of the resonator 30, and two capacitors C22 and C32 provided in a path 4 connecting the other end of the resonator 20 and the other end of the resonator 30. Each of the paths 3 and 4 is connected to the ground.

The resonator 10 is provided in parallel to the resonator 20 between the pair of balanced input ports 11 and 12 and the resonator 20 in the circuit configuration. The resonator 10 corresponds to a "third resonator" in the present invention.

The resonator 40 is provided in parallel to the resonator 30 between the pair of balanced output ports 21 and 22 and the resonator 30 in the circuit configuration. The resonator 40 corresponds to a "fourth resonator" in the present invention.

The filter circuit 1 further includes two input inductors L11 and L12 electrically connected to the pair of balanced input ports 11 and 12, and two output inductors L21 and L22 electrically connected to the pair of balanced output ports 21 and 22. The two input inductors L11 and L12 are provided between the pair of balanced input ports 11 and 12 and the resonator 10 in the circuit configuration. The two output inductors L21 and L22 are provided between the pair of balanced output ports 21 and 22 and the resonator 40 in the circuit configuration.

The filter circuit 1 further includes capacitors C1, C2, C3, C4, C5, C6, C11, C12, C41, and C42.

With reference to FIG. 1, a connection relationship between a plurality of components constituting the filter circuit 1 will be described below in detail. The resonator 10 includes an inductor L1. One end of the input inductor L11 is connected to one end of the inductor L1. One end of the input inductor L12 is connected to the other end of the inductor L1. The other end of the input inductor L11 is connected to the balanced input port 11. The other end of the input inductor L12 is connected to the balanced input port 12.

One end of the capacitor C11 is connected to one end of the inductor L1. One end of the capacitor C12 is connected to the other end of the inductor L1. The other end of each of the capacitors C11 and C12 is connected to the ground.

The resonator 20 includes an inductor L2. One end of the capacitor C21 is connected to one end of the inductor L2. One end of the capacitor C22 is connected to the other end of the inductor L2. The other end of each of the capacitors C21 and C22 is connected to the ground.

One end of the capacitor C1 is connected to one end of each of the inductor L1 and the input inductor L11. The other end of the capacitor C1 is connected to one end of the inductor L2. One end of the capacitor C2 is connected to the other end of the inductor L1 and one end of the input inductor L12. The other end of the capacitor C2 is connected to the other end of the inductor L2.

The resonator 30 includes an inductor L3. One end of the capacitor C31 is connected to one end of the inductor L3. One end of the capacitor C32 is connected to the other end of the inductor L3. The other end of each of the capacitors C31 and C32 is connected to the ground.

The resonator 40 includes an inductor L4. One end of the output inductor L21 is connected to one end of the inductor L4. One end of the output inductor L22 is connected to the other end of the inductor L4. The other end of the output inductor L21 is connected to the balanced output port 21. The other end of the output inductor L22 is connected to the balanced output port 22.

One end of the capacitor C41 is connected to one end of the inductor L4. One end of the capacitor C42 is connected to the other end of the inductor L4. The other end of each of the capacitors C41 and C42 is connected to the ground.

One end of the capacitor C3 is connected to one end of the inductor L3. The other end of the capacitor C3 is connected to one end of each of the inductor L4 and the output inductor L21. One end of the capacitor C4 is connected to the other end of the inductor L3. The other end of the capacitor C4 is connected to the other end of the inductor L4 and one end of the output inductor L22.

One end of the capacitor C5 is connected to one end of each of the inductor L1 and the input inductor L11. The other end of the capacitor C5 is connected to one end of each of the inductor L4 and the output inductor L21. One end of the capacitor C6 is connected to the other end of the inductor L1 and one end of the input inductor L12. The other end of the capacitor C6 is connected to the other end of the inductor L4 and one end of the output inductor L22.

Here, of the filter circuit 1, in the circuit configuration, a part including the pair of balanced input ports 11 and 12, the resonator 10 (inductor L1), the resonator 20 (inductor L2), the input inductors L11 and L12, and the capacitors C1, C2, C11, C12, C21, and C22 is referred to as a first part. Of the filter circuit 1, in the circuit configuration, a part including the pair of balanced output ports 21 and 22, the resonator 30 (inductor L3), the resonator 40 (inductor L4), the output inductors L21 and L22, and the capacitors C3, C4, C31, C32, C41, and C42 is referred to as a second part. The filter circuit 1 has a circuit configuration in which the first part and the second part are configured to be symmetrical with respect to the center between the resonator 20 (inductor L2) and the resonator 30 (inductor L3). In other words, in the filter circuit 1, in the circuit configuration, the plurality of inductors and the plurality of capacitors included in the first part and the plurality of inductors and the plurality of capacitors included in the second part are arranged to be symmetrical with respect to the center between the resonator 20 (inductor L2) and the resonator 30 (inductor L3).

Of the filter circuit 1, in the circuit configuration, a part including the balanced input port 11, the balanced output port 21, the input inductor L11, the output inductor L21, and the capacitors C1, C3, C5, C11, C21, C31, and C41 is referred to as a third part. Of the filter circuit 1, in the circuit configuration, a part including the balanced input port 12, the balanced output port 22, the input inductor L12, the output inductor L22, and the capacitors C2, C4, C6, C12, C22, C32, and C42 is referred to as a fourth part. The filter circuit 1 has a circuit configuration in which the third part and the fourth part are configured to be symmetrical with respect to the resonator 20 (inductor L2) and the resonator 30 (inductor L3). In other words, in the filter circuit 1, in the circuit configuration, the plurality of inductors and the plurality of capacitors included in the third part and the plurality of inductors and the plurality of capacitors included in the fourth part are arranged to be symmetrical with respect to the resonator 20 (inductor L2) and the resonator 30 (inductor L3).

Figure 2:
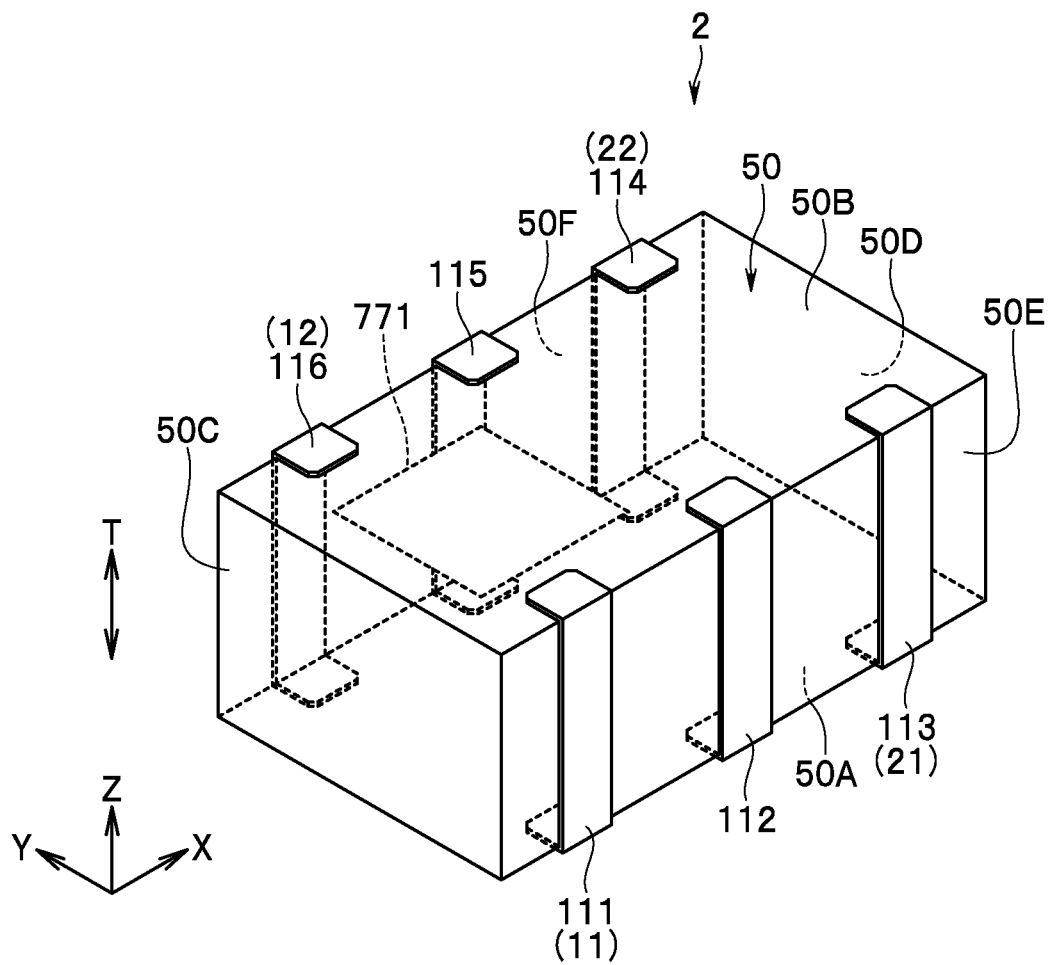
FIG. 2 is a perspective view showing an external appearance of a multilayered filter device according to the embodiment of the present invention.

Next, with reference to FIG. 2, a configuration of a multilayered filter device (hereinafter simply referred to as a filter device) 2 according to the present embodiment will be described. FIG. 2 is a perspective view showing an external appearance of the filter device 2. The filter device 2 is a balanced filter device including the balanced filter circuit 1.

The filter device 2 includes the components of the filter circuit 1 described with reference to FIG. 1, and a stack 50 for integrating the components of the filter circuit 1. The stack 50 includes a plurality of dielectric layers stacked together and a plurality of conductor layers and a plurality of through holes formed in the plurality of dielectric layers.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F. are perpendicular to the top surface 50B and the bottom surface 50A.

Here, an X direction, a Y direction, and a Z direction are defined as shown in FIG. 2. The X direction, the Y direction, and the Z direction are orthogonal to one another. In the present embodiment, a direction parallel to the stacking direction T is defined as the Z direction. A direction opposite to the X direction is defined as a −X direction, a direction opposite to the Y direction is defined as a −Y direction, and a direction opposite to the Z direction is defined as a −Z direction.

As shown in FIG. 2, the bottom surface 50A is located at the end of the stack 50 in the −Z direction. The top surface 50B is located at the end of the stack 50 in the Z direction. The shape of each of the bottom surface 50A and the top surface 50B is a rectangular shape that is long in the X direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 2 further includes terminals 111, 112, 113, 114, 115, and 116. Each of the terminals 111 to 113 is arranged to extend from the top surface 50B to the bottom surface 50A via the side surface 50E. The terminals 111 to 113 are arranged in this order in the X direction. Each of the terminals 114 to 116 is arranged to extend from the top surface 50B to the bottom surface 50A via the side surface 50F. The terminals 114 to 116 are arranged in this order in the −X direction.

Of the terminal 111 to 116, two terminals are a pair of balanced input terminals corresponding to the pair of balanced input ports 11 and 12, and other two terminals are a pair of balanced output terminals corresponding to the pair of balanced output ports 21 and 22. In the present embodiment, the terminals 111 and 116 may be the pair of balanced input terminals, or the terminals 113 and 114 may be the pair of balanced input terminals. When the terminals 111 and 116 are the pair of balanced input terminals, the terminals 113 and 114 may be the pair of balanced output terminals. When the terminals 113 and 114 are the pair of balanced input terminals, the terminals 111 and 116 may be the pair of balanced output terminals.

The following description will be given by taking an example of a case in which the terminals 111 and 116 are the pair of balanced input terminals, and the terminals 113 and 114 are the pair of balanced output terminals. In the following description, the terminals 111 and 116 are also respectively referred to as balanced input terminals 111 and 116, and the terminals 113 and 114 are also respectively referred to as balanced output terminals 113 and 114. The filter device 2 includes the pair of balanced input terminals 111 and 116 and the pair of balanced output terminals 113 and 114.

The balanced input terminal 111 corresponds to the balanced input port 11, and the balanced input terminal 116 corresponds to the balanced input port 12. The balanced output terminal 113 corresponds to the balanced output port 21, and the output terminal 114 corresponds to the balanced output port 22. Each of the terminals 112 and 115 is connected to the ground.

Next, with reference to FIG. 3A to FIG. 7B, an example of the plurality of dielectric layers and the plurality of conductor layers constituting the stack 50 will be described. In the present example, the stack 50 includes twenty-seven dielectric layers stacked together. The twenty-seven dielectric layers are hereinafter referred to as first to twenty-seventh dielectric layers in the order from bottom to top. The first to twenty-seventh dielectric layers are denoted by reference numerals 51 to 77, respectively.

Figure 3A:
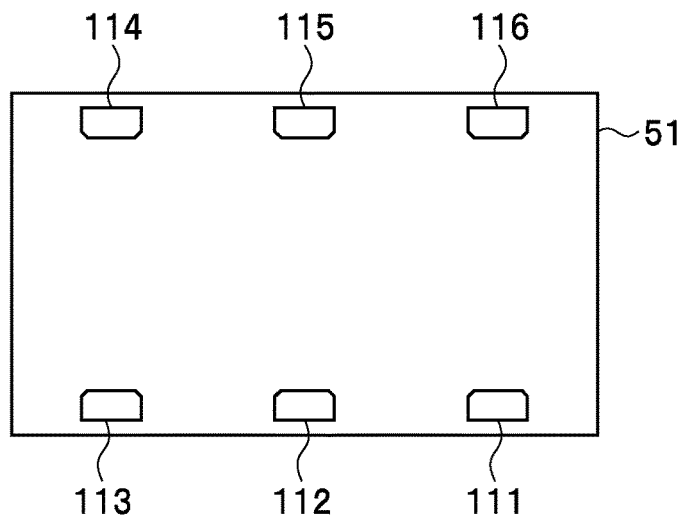
FIG. 3A to FIG. 3C are explanatory diagrams showing respective patterned surfaces of first to third dielectric layers of a stack of the multilayered filter device according to the embodiment of the present invention.

FIG. 3A shows a patterned surface of the first dielectric layer 51. A part of each of the terminal 111 to 116 is formed on the patterned surface of the dielectric layer 51.

Figure 3B:
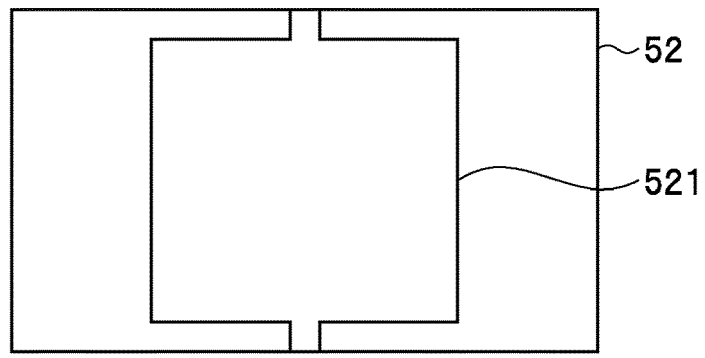

FIG. 3B shows a patterned surface of the second dielectric layer 52. A conductor layer 521 is formed on the patterned surface of the dielectric layer 52. The conductor layer 521 is connected to the terminals 112 and 115 (see FIG. 2).

Figure 3C:
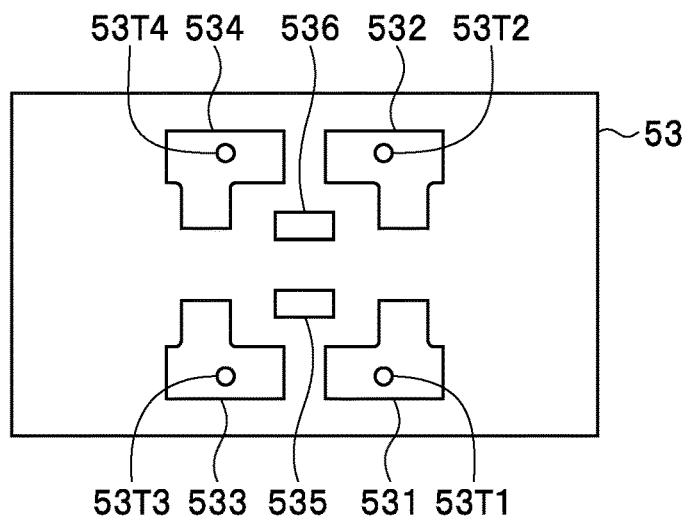

FIG. 3C shows a patterned surface of the third dielectric layer 53. Conductor layers 531, 532, 533, 534, 535, and 536 are formed on the patterned surface of the dielectric layer 53. Through holes 53T1, 53T2, 53T3, and 53T4 are formed in the dielectric layer 53. The through holes 53T1 to 53T4 are connected to the conductor layers 531 to 534, respectively.

Figure 4A:
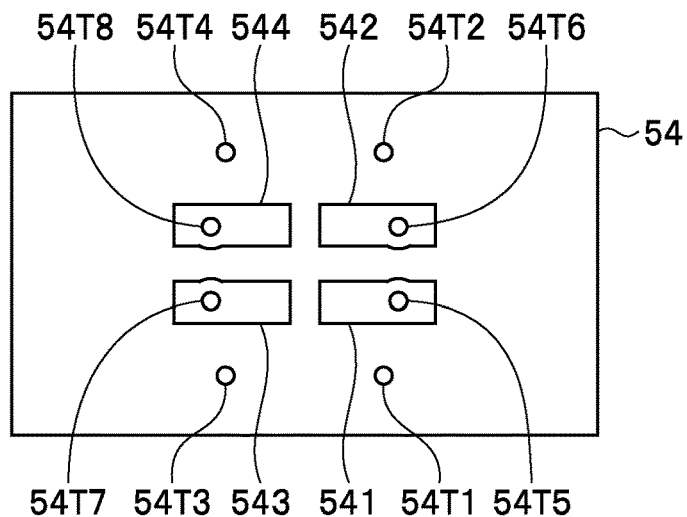
FIG. 4A to FIG. 4C are explanatory diagrams showing respective patterned surfaces of fourth to sixth dielectric layers of the stack of the multilayered filter device according to the embodiment of the present invention.

FIG. 4A shows a patterned surface of the fourth dielectric layer 54. Conductor layers 541, 542, 543, and 544 are formed on the patterned surface of the dielectric layer 54. Through holes 54T1, 54T2, 54T3, 54T4, 54T5, 54T6, 54T7, and 54T8 are formed in the dielectric layer 54. The through holes 53T1 to 53T4 formed in the dielectric layer 53 are connected to the through holes 54T1 to 54T4, respectively. The through holes 54T5 to 54T8 are connected to the conductor layers 541 to 544, respectively.

Figure 4B:
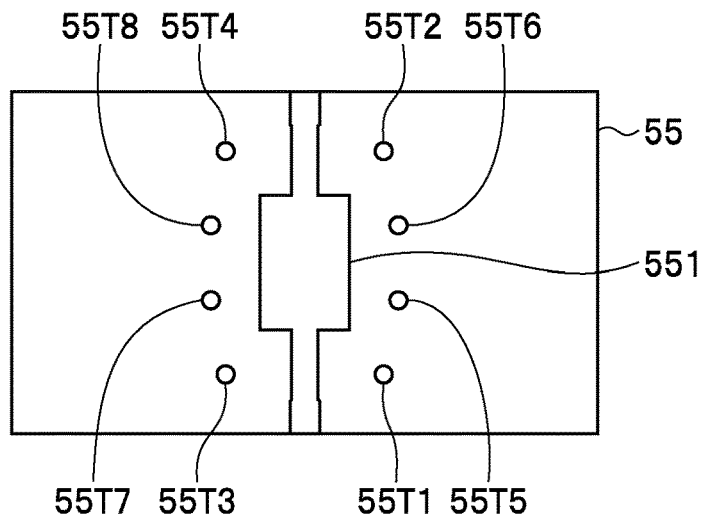

FIG. 4B shows a patterned surface of the fifth dielectric layer 55. A conductor layer 551 is formed on the patterned surface of the dielectric layer 55. The conductor layer 551 is connected to the terminals 112 and 115 (see FIG. 2). Through holes 55T1, 55T2, 55T3, 55T4, 55T5, 55T6, 55T7, and 55T8 are formed in the dielectric layer 55. The through holes 54T1 to 54T8 formed in the dielectric layer 54 are connected to the through holes 55T1 to 55T8, respectively.

Figure 4C:
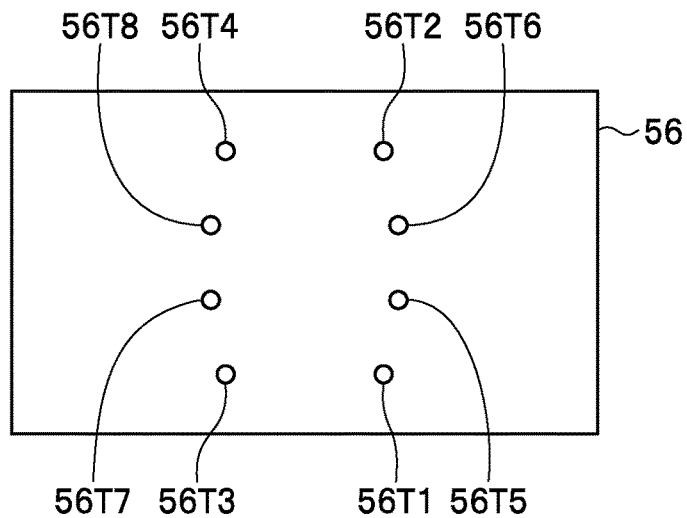

FIG. 4C shows a patterned surface of the sixth dielectric layer 56. Through holes 56T1, 56T2, 56T3, 56T4, 56T5, 56T6, 56T7, and 56T8 are formed in the dielectric layer 56. The through holes 55T1 to 55T8 formed in the dielectric layer 55 are connected to the through holes 56T1 to 56T8, respectively.

Figure 5A:
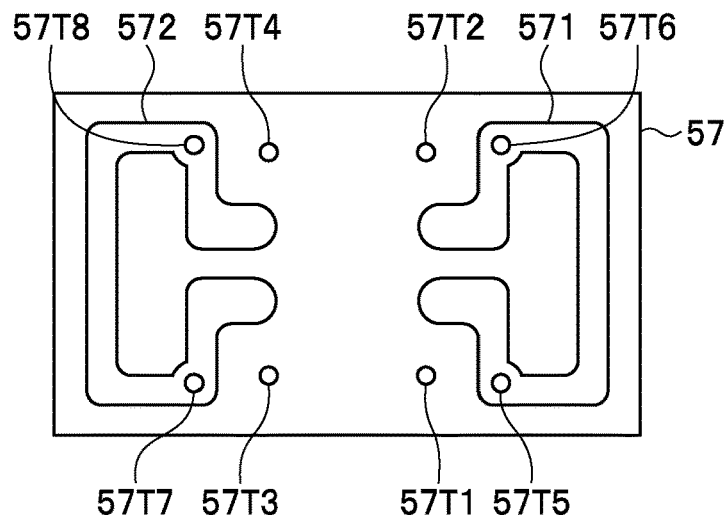
FIG. 5A to FIG. 5C are explanatory diagrams showing respective patterned surfaces of seventh to ninth dielectric layers of the stack of the multilayered filter device according to the embodiment of the present invention.

FIG. 5A shows a patterned surface of the seventh dielectric layer 57. Inductor conductor layers 571 and 572 are formed on the patterned surface of the dielectric layer 57. Each of the conductor layers 571 and 572 has a first end and a second end opposite to each other. The through hole 56T5 formed in the dielectric layer 56 is connected to a portion of the conductor layer 571 near the first end thereof. The through hole 56T6 formed in the dielectric layer 56 is connected to a portion of the conductor layer 571 near the second end thereof. The through hole 56T7 formed in the dielectric layer 56 is connected to a portion of the conductor layer 572 near the first end thereof. The through hole 56T8 formed in the dielectric layer 56 is connected to a portion of the conductor layer 572 near the second end thereof.

Through holes 57T1, 57T2, 57T3, 57T4, 57T5, 57T6, 57T7, and 57T8 are formed in the dielectric layer 57. The through holes 56T1 to 56T4 formed in the dielectric layer 56 are connected to the through holes 57T1 to 57T4, respectively. The through hole 57T5 is connected to a portion which is between the first end and the second end of the conductor layer 571 and closer to the first end than to the second end. The through hole 57T6 is connected to a portion which is between the first end and the second end of the conductor layer 571 and closer to the second end than to the first end. The through hole 57T7 is connected to a portion which is between the first end and the second end of the conductor layer 572 and closer to the first end than to the second end. The through hole 57T8 is connected to a portion which is between the first end and the second end of the conductor layer 572 and closer to the second end than to the first end.

Figure 5B:
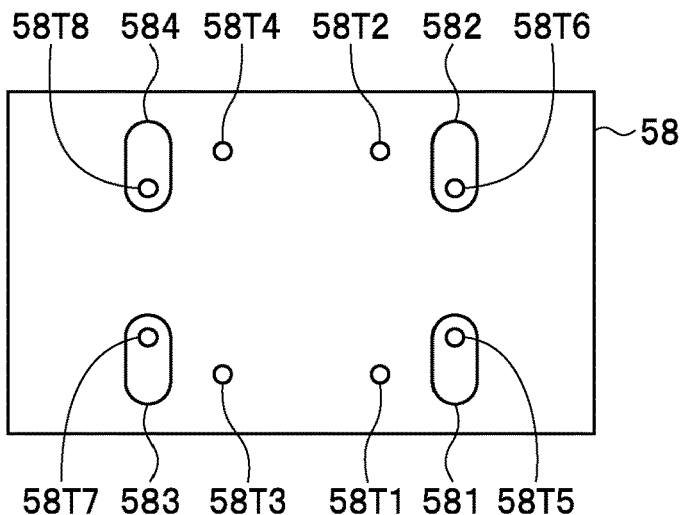

FIG. 5B shows a patterned surface of the eighth dielectric layer 58. Conductor layers 581, 582, 583, and 584 are formed on the patterned surface of the dielectric layer 58. Through holes 58T1, 58T2, 58T3, 58T4, 58T5, 58T6, 58T7, and 58T8 are formed in the dielectric layer 58. The through holes 57T1 to 57T4 formed in the dielectric layer 57 are connected to the through holes 58T1 to 58T4, respectively. The through hole 57T5 formed in the dielectric layer 57 and the through hole 58T5 are connected to the conductor layer 581. The through hole 57T6 formed in the dielectric layer 57 and the through hole 58T6 are connected to the conductor layer 582. The through hole 57T7 formed in the dielectric layer 57 and the through hole 58T7 are connected to the conductor layer 583. The through hole 57T8 formed in the dielectric layer 57 and the through hole 58T8 are connected to the conductor layer 584.

Figure 5C:
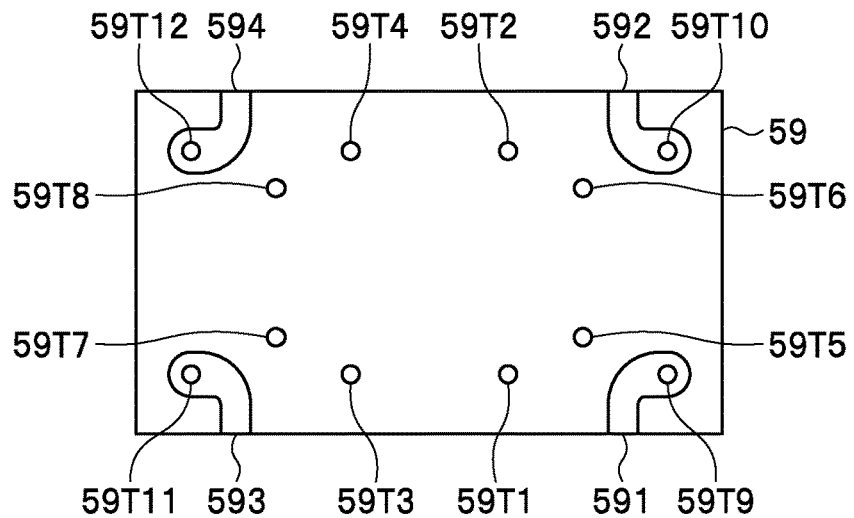

FIG. 5C shows a patterned surface of the ninth dielectric layer 59. Conductor layers 591, 592, 593, and 594 are formed on the patterned surface of the dielectric layer 59. The conductor layer 591 is connected to the balanced input terminal 111 (see FIG. 2). The conductor layer 592 is connected to the balanced input terminal 116 (see FIG. 2). The conductor layer 593 is connected to the balanced output terminal 113 (see FIG. 2). The conductor layer 594 is connected to the balanced output terminal 114 (see FIG. 2).

Through holes 59T1, 59T2, 59T3, 59T4, 59T5, 59T6, 59T7, 59T8, 59T9, 59T10, 59T11, and 59T12 are formed in the dielectric layer 59. The through holes 58T1 to 58T8 formed in the dielectric layer 58 are connected to the through holes 59T1 to 59T8, respectively. The through holes 59T9 to 59T12 are connected to the conductor layers 591 to 594, respectively.

Figure 6A:
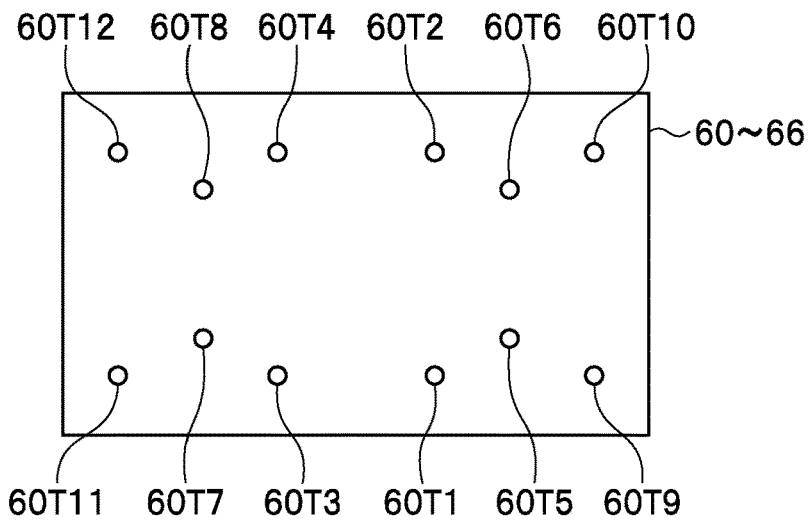
FIG. 6A is an explanatory diagram showing respective patterned surfaces of tenth to sixteenth dielectric layers of the stack of the multilayered filter device according to the embodiment of the present invention.

FIG. 6A shows a patterned surface of each of the tenth to sixteenth dielectric layers 60 to 66. Through holes 60T1, 60T2, 60T3, 60T4, 60T5, 60T6, 60T7, 60T8, 60T9, 60T10, 60T11, and 60T12 are formed in each of the dielectric layers 60 to 66. The through holes 59T1 to 59T12 formed in the dielectric layer 59 are connected to the through holes 60T1 to 60T12 formed in the dielectric layer 60, respectively. In the dielectric layers 60 to 66, vertically adjacent through holes denoted by the same reference numerals are connected to each other.

Figure 6B:
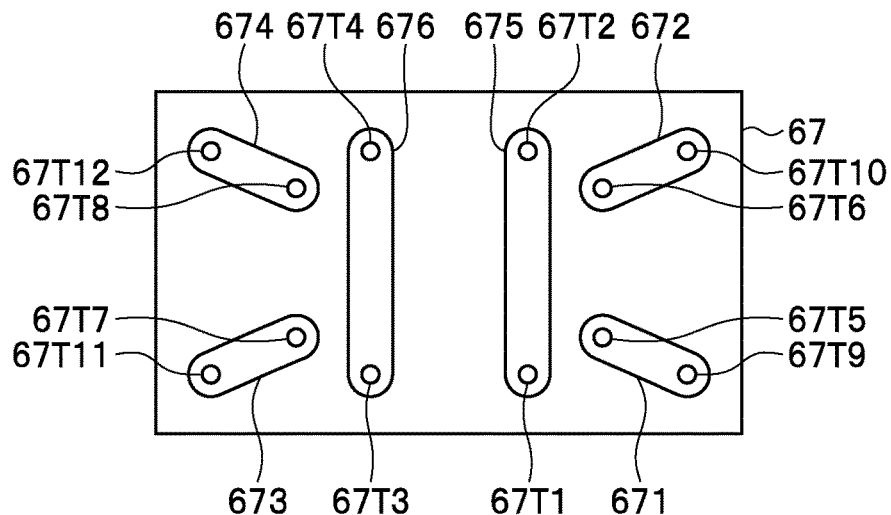
FIG. 6B is an explanatory diagram showing a patterned surface of a seventeenth dielectric layer of the stack of the multilayered filter device according to the embodiment of the present invention.

FIG. 6B shows a patterned surface of the seventeenth dielectric layer 67. Inductor conductor layers 671, 672, 673, 674, 675, and 676 are formed on the patterned surface of the dielectric layer 67. Each of the conductor layers 671 to 676 has a first end and a second end opposite to each other.

Through holes 67T1, 67T2, 67T3, 67T4, 67T5, 67T6, 67T7, 67T8, 67T9, 67T10, 67T11, and 67T12 are formed in the dielectric layer 67. The through hole 60T1 formed in the dielectric layer 66 and the through hole 67T1 are connected to a portion of the conductor layer 675 near the first end thereof. The through hole 60T2 formed in the dielectric layer 66 and the through hole 67T2 are connected to a portion of the conductor layer 675 near the second end thereof. The through hole 60T3 formed in the dielectric layer 66 and the through hole 67T3 are connected to a portion of the conductor layer 676 near the first end thereof. The through hole 60T4 formed in the dielectric layer 66 and the through hole 67T4 are connected to a portion of the conductor layer 676 near the second end thereof.

The through hole 60T5 formed in the dielectric layer 66 and the through hole 67T5 are connected to a portion of the conductor layer 671 near the first end thereof. The through hole 60T9 formed in the dielectric layer 66 and the through hole 67T9 are connected to a portion of the conductor layer 671 near the second end thereof. The through hole 60T6 formed in the dielectric layer 66 and the through hole 67T6 are connected to a portion of the conductor layer 672 near the first end thereof. The through hole 60T10 formed in the dielectric layer 66 and the through hole 67T10 are connected to a portion of the conductor layer 672 near the second end thereof.

The through hole 60T7 formed in the dielectric layer 66 and the through hole 67T7 are connected to a portion of the conductor layer 673 near the first end thereof. The through hole 60T11 formed in the dielectric layer 66 and the through hole 67T11 are connected to a portion of the conductor layer 673 near the second end thereof. The through hole 60T8 formed in the dielectric layer 66 and the through hole 67T8 are connected to a portion of the conductor layer 674 near the first end thereof. The through hole 60T12 formed in the dielectric layer 66 and the through hole 67T12 are connected to a portion of the conductor layer 674 near the second end thereof.

Figure 6C:
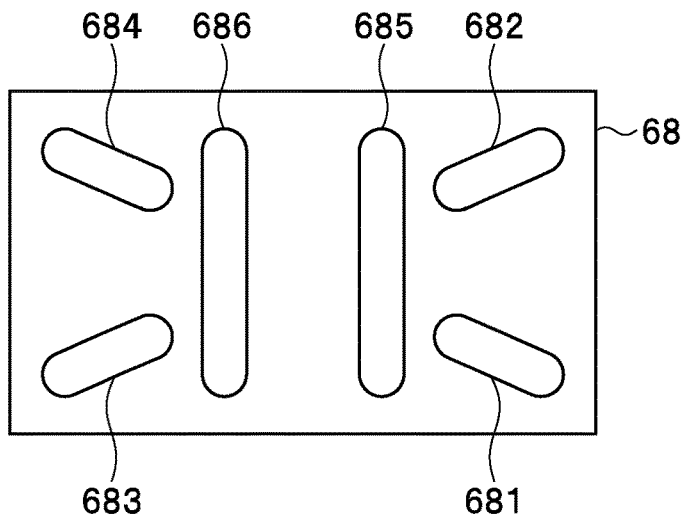
FIG. 6C is an explanatory diagram showing a patterned surface of an eighteenth dielectric layer of the stack of the multilayered filter device according to the embodiment of the present invention.

FIG. 6C shows a patterned surface of the eighteenth dielectric layer 68. Inductor conductor layers 681, 682, 683, 684, 685, and 686 are formed on the patterned surface of the dielectric layer 68. Each of the conductor layers 681 to 686 has a first end and a second end opposite to each other. The through hole 67T1 formed in the dielectric layer 67 is connected to a portion of the conductor layer 685 near the first end thereof. The through hole 67T2 formed in the dielectric layer 67 is connected to a portion of the conductor layer 685 near the second end thereof. The through hole 67T3 formed in the dielectric layer 67 is connected to a portion of the conductor layer 686 near the first end thereof. The through hole 67T4 formed in the dielectric layer 67 is connected to a portion of the conductor layer 686 near the second end thereof.

The through hole 67T5 formed in the dielectric layer 67 is connected to a portion of the conductor layer 681 near the first end thereof. The through hole 67T9 formed in the dielectric layer 67 is connected to a portion of the conductor layer 681 near the second end thereof. The through hole 67T6 formed in the dielectric layer 67 is connected to a portion of the conductor layer 682 near the first end thereof. The through hole 67T10 formed in the dielectric layer 67 is connected to a portion of the conductor layer 682 near the second end thereof.

The through hole 67T7 formed in the dielectric layer 67 is connected to a portion of the conductor layer 683 near the first end thereof. The through hole 67T11 formed in the dielectric layer 67 is connected to a portion of the conductor layer 683 near the second end thereof. The through hole 67T8 formed in the dielectric layer 67 is connected to a portion of the conductor layer 684 near the first end thereof. The through hole 67T12 formed in the dielectric layer 67 is connected to a portion of the conductor layer 684 near the second end thereof.

Figure 7A:
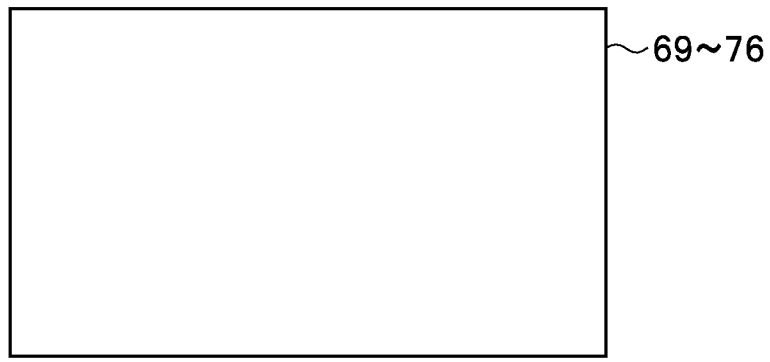
FIG. 7A is an explanatory diagram showing respective patterned surfaces of nineteenth to twenty-sixth dielectric layers of the stack of the multilayered filter device according to the embodiment of the present invention.

FIG. 7A shows a patterned surface of each of the nineteenth to twenty-sixth dielectric layers 69 to 76. Neither conductor layers nor through holes are formed in the dielectric layers 69 to 76.

Figure 7B:
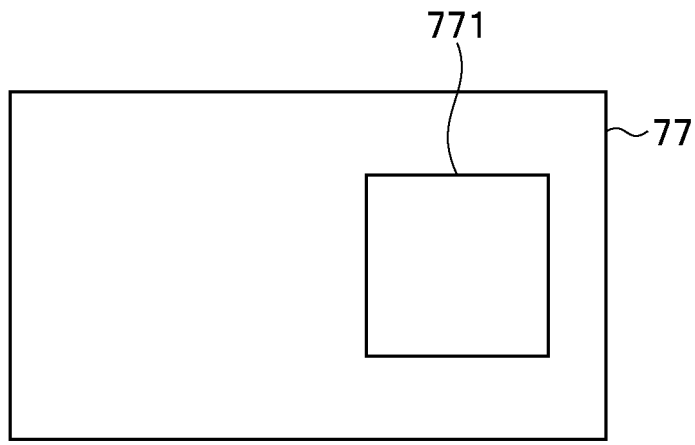
FIG. 7B is an explanatory diagram showing a patterned surface of a twenty-seventh dielectric layer of the stack of the multilayered filter device according to the embodiment of the present invention.

FIG. 7B shows a patterned surface of the twenty-seventh dielectric layer 77. A mark 771 formed of a conductor layer is formed on the patterned surface of the dielectric layer 77.

The stack 50 shown in FIG. 2 is formed by stacking the first to twenty-seventh dielectric layers 51 to 77 such that the patterned surface of the first dielectric layer 51 serves as the bottom surface 50A of the stack 50 and the surface of the twenty-seventh dielectric layer 77 opposite to the patterned surface thereof serves as the top surface 50B of the stack 50.

Figure 8:
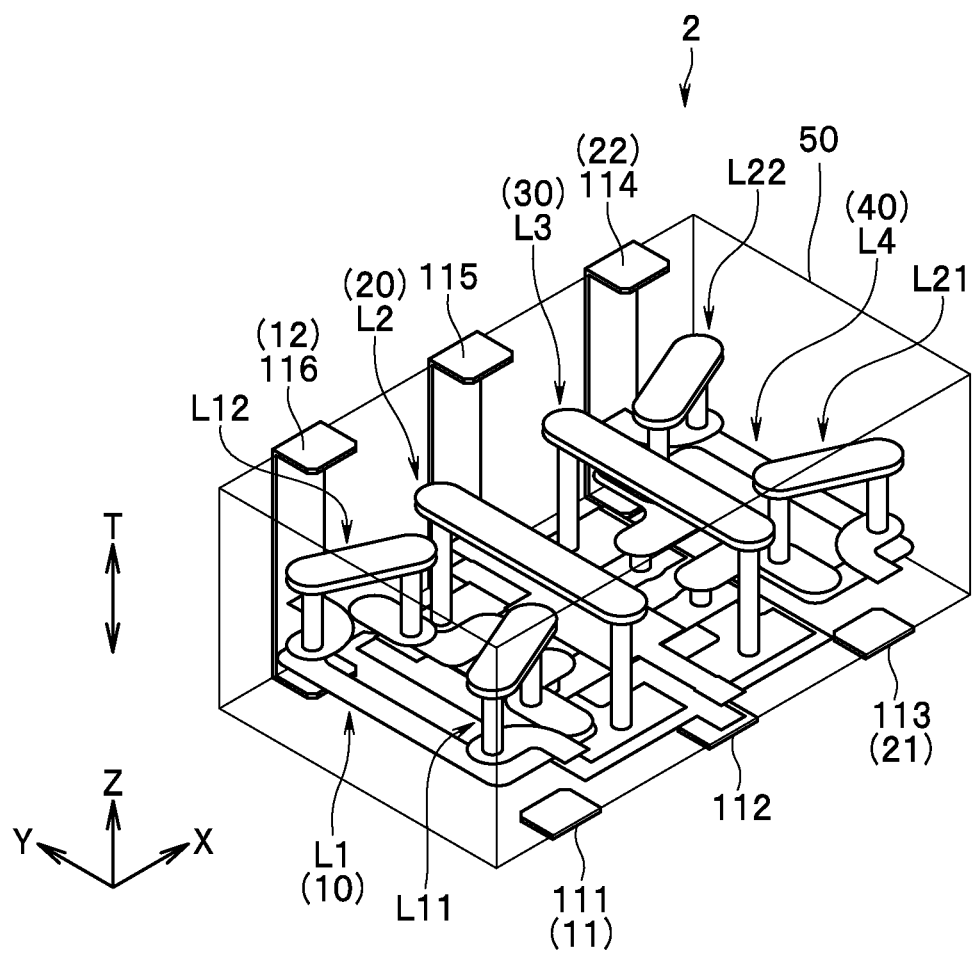
FIG. 8 is a perspective view showing an internal structure of the stack of the multilayered filter device according to the embodiment of the present invention.

FIG. 8 shows an internal structure of the stack 50 formed by stacking the first to twenty-seventh dielectric layers 51 to 77. As shown in FIG. 8, in the internal structure of the stack 50, the plurality of conductor layers and the plurality of through holes shown in FIG. 3A to FIG. 6C are stacked. Note that the mark 771 is omitted in FIG. 8.

Correspondences between the components of the filter circuit 1 shown in FIG. 1 and the internal components of the stack 50 shown in FIG. 3A to FIG. 6C will be described below. The inductor L1 of the resonator 10 is formed of the inductor conductor layer 571 shown in FIG. 5A.

The inductor L2 of the resonator 20 is formed of the inductor conductor layers 675 and 685 shown in FIG. 6B and FIG. 6C and through holes nT1 and nT2 shown in FIG. 3C to FIG. 6B. Note that, regarding the reference numerals to denote the through holes, n is an integer from 53 to 60, or 67.

The inductor L3 of the resonator 30 is formed of the inductor conductor layers 676 and 686 shown in FIG. 6B and FIG. 6C and through holes nT3 and nT4 shown in FIG. 3C to FIG. 6B.

The inductor L4 of the resonator 40 is formed of the inductor conductor layer 572 shown in FIG. 5A.

The input inductor L11 is formed of the inductor conductor layers 671 and 681 shown in FIG. 6B and FIG. 6C and through holes kT5 and mT9 shown in FIG. 5B to FIG. 6B. Note that, regarding the reference numerals to denote the through holes, k is an integer from 58 to 60, or 67, and m is 59, 60, or 67.

The input inductor L12 is formed of the inductor conductor layers 672 and 682 shown in FIG. 6B and FIG. 6C, and through holes kT6 and mT10 shown in FIG. 5B to FIG. 6B.

The output inductor L21 is formed of the inductor conductor layers 673 and 683 shown in FIG. 6B and FIG. 6C, and through holes kT7 and mT11 shown in FIG. 5B to FIG. 6B.

The output inductor L22 is formed of the inductor conductor layers 674 and 684 shown in FIG. 6B and FIG. 6C, and through holes kT8 and mT12 shown in FIG. 5B to FIG. 6B.

The capacitor C1 is formed of the conductor layers 531 and 541 and the dielectric layer 53 between these conductor layers shown in FIG. 3C and FIG. 4A. The capacitor C2 is formed of the conductor layers 532 and 542 and the dielectric layer 53 between these conductor layers shown in FIG. 3C and FIG. 4A. The capacitor C3 is formed of the conductor layers 533 and 543 and the dielectric layer 53 between these conductor layers shown in FIG. 3C and FIG. 4A. The capacitor C4 is formed of the conductor layers 534 and 544 and the dielectric layer 53 between these conductor layers shown in FIG. 3C and FIG. 4A.

The capacitor C5 is formed of the conductor layers 535, 541, and 543 and the dielectric layer 53 between these conductor layers shown in FIG. 3C and FIG. 4A. The capacitor C6 is formed of the conductor layers 536, 542, and 544 and the dielectric layer 53 between these conductor layers shown in FIG. 3C and FIG. 4A.

The capacitor C11 is formed of the conductor layers 541 and 551 and the dielectric layer 54 between these conductor layers shown in FIG. 4A and FIG. 4B. The capacitor C12 is formed of the conductor layers 542 and 551 and the dielectric layer 54 between these conductor layers shown in FIG. 4A and FIG. 4B.

The capacitor C21 is formed of the conductor layers 521 and 531 and the dielectric layer 52 between these conductor layers shown in FIG. 3B and FIG. 3C. The capacitor C22 is formed of the conductor layers 521 and 532 and the dielectric layer 52 between these conductor layers shown in FIG. 3B and FIG. 3C.

The capacitor C31 is formed of the conductor layers 521 and 533 and the dielectric layer 52 between these conductor layers shown in FIG. 3B and FIG. 3C. The capacitor C32 is formed of the conductor layers 521 and 534 and the dielectric layer 52 between these conductor layers shown in FIG. 3B and FIG. 3C.

The capacitor C41 is formed of the conductor layers 543 and 551 and the dielectric layer 54 between these conductor layers shown in FIG. 4A and FIG. 4B. The capacitor C42 is formed of the conductor layers 544 and 551 and the dielectric layer 54 between these conductor layers shown in FIG. 4A and FIG. 4B.

Figure 9:
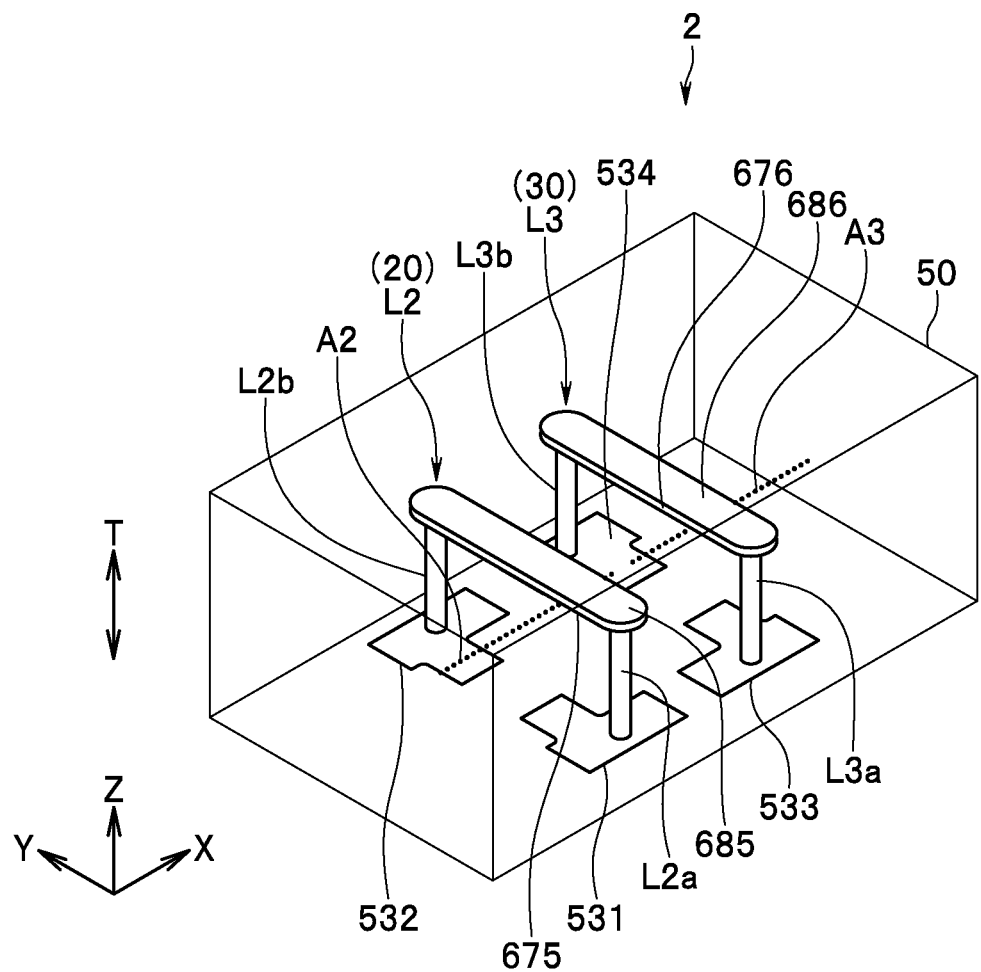
FIG. 9 is a perspective view showing first and second inductors of the multilayered filter device according to the embodiment of the present invention.
Figure 10:
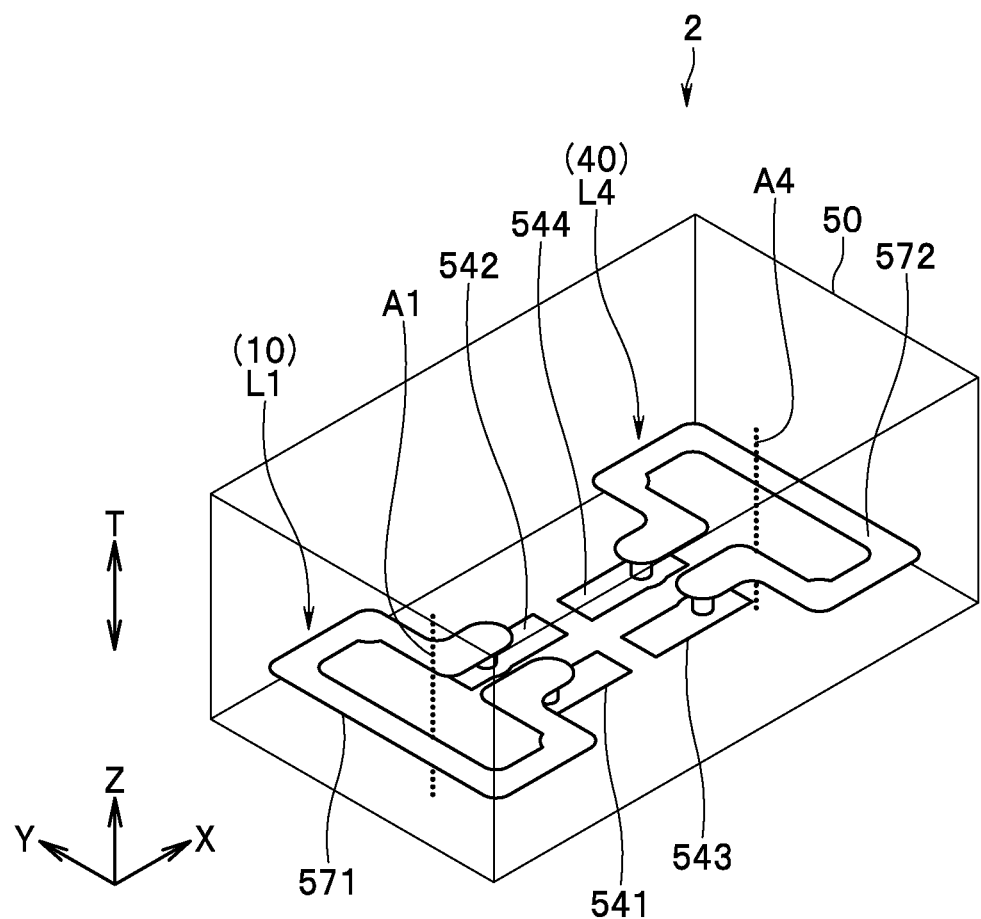
FIG. 10 is a perspective view showing third and fourth inductors of the multilayered filter device according to the embodiment of the present invention.
Figure 11:
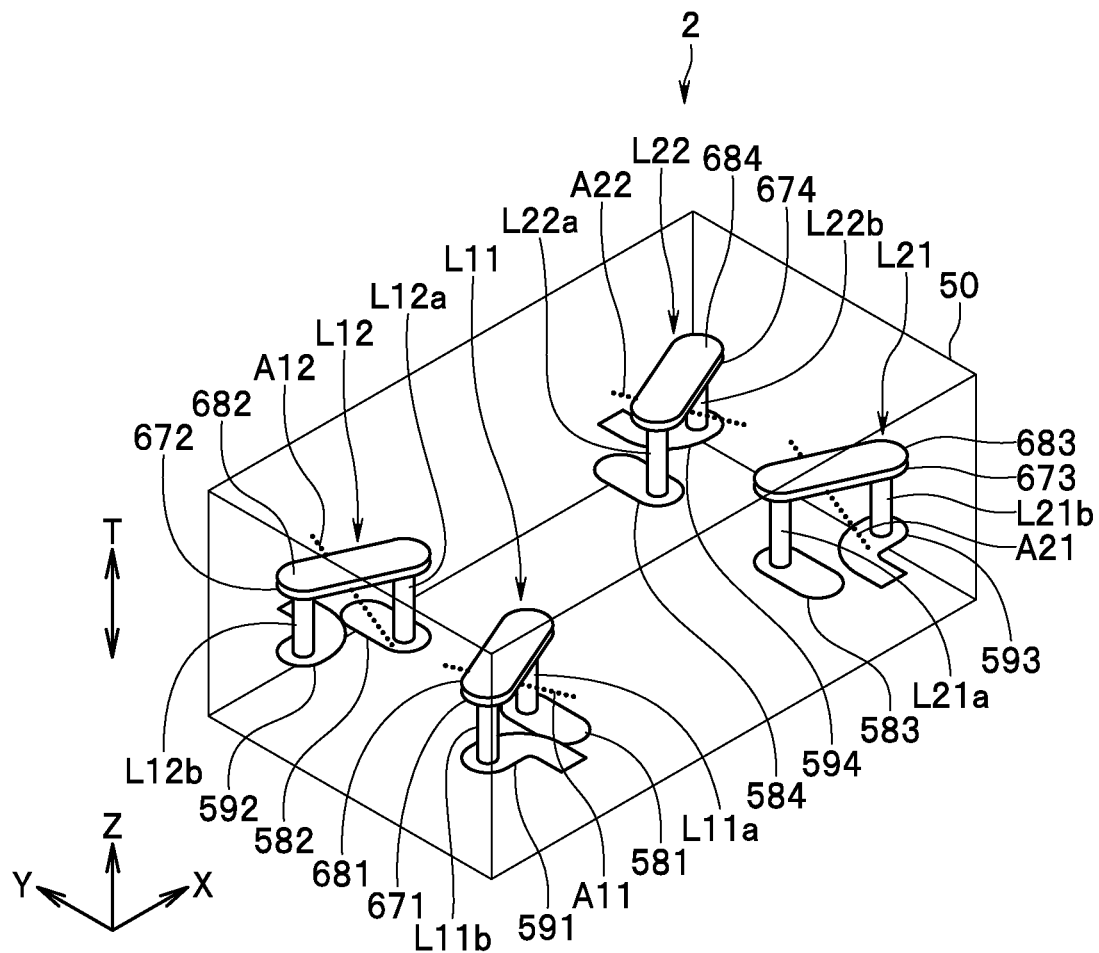
FIG. 11 is a perspective view showing input inductors and output inductors of the multilayered filter device according to the embodiment of the present invention.

Next, with reference to FIG. 2 and FIG. 8 to FIG. 11, structural features of the filter device 2 according to the present embodiment will be described. FIG. 9 is a perspective view showing the inductors L2 and L3. FIG. 10 is a perspective view showing the inductors L1 and L4. FIG. 11 is a perspective view showing the input inductors L11 and L12 and the output inductors L21 and L22.

First, the inductors L2 and L3 will be described. As shown in FIG. 8 and FIG. 9, the inductors L2 and L3 are arrayed in a long-side direction of the bottom surface 50A or the top surface 50B, in other words, a direction parallel to the X direction. The inductor L2 is arranged at a position closer to the side surface 50C than to the side surface 50D. The inductor L3 is arranged at a position closer to the side surface 50D than to the side surface 50C.

The inductor L2 is wound around an axis A2. The inductor L3 is wound around an axis A3. Each of the axes A2 and A3 extends in a direction orthogonal to the stacking direction T. In the present embodiment in particular, each of the axes A2 and A3 extends in a direction parallel to the X direction. In FIG. 9, for the sake of convenience, the axis A2 and the axis A3 are depicted with straight lines different from each other. However, the axes A2 and A3 may be one axis.

As shown in FIG. 8 and FIG. 9, an opening of the inductor L2 and an opening of the inductor L3 face each other. In other words, the opening of the inductor L2 and the opening of the inductor L3 overlap each other when seen in the X direction. Accordingly, in the present embodiment, magnetic coupling between the inductors L2 and L3 is stronger than when the opening of the inductor L2 and the opening of the inductor L3 do not overlap each other.

The inductor L2 corresponds to a "first inductor" in the present invention. The inductor L3 corresponds to a "second inductor" in the present invention.

Here, a structure formed with two or more through holes being connected in series is referred to as a through hole line. The inductor L2 includes a first through hole line L2a, a second through hole line L2b, and the conductor layers 675 and 685 connecting the first through hole line L2a and the second through hole line L2b. The first through hole line L2a is formed with the plurality of through holes nT1 being connected in series. The second through hole line L2b is formed with the plurality of through holes nT2 being connected in series. Note that, as described above, n is an integer from 53 to 60, or 67.

Each of the conductor layers 675 and 685 extends in a short-side direction of the bottom surface 50A or the top surface 50B, in other words, a direction parallel to the Y direction. The first through hole line L2a and the second through hole line L2b are arrayed in the direction parallel to the Y direction. The opening of the inductor L2 is a region surrounded by the first through hole line L2a, the second through hole line L2b, and the conductor layer 675.

The inductor L3 includes a first through hole line L3a, a second through hole line L3b, and the conductor layers 676 and 686 connecting the first through hole line L3a and the second through hole line L3b. The first through hole line L3a is formed with the plurality of through holes nT3 being connected in series. The second through hole line L3b is formed with the plurality of through holes nT4 being connected in series.

Each of the conductor layers 676 and 686 extends in a short-side direction of the bottom surface 50A and the top surface 50B, in other words, a direction parallel to the Y direction. The first through hole line L3a and the second through hole line L3b are arrayed in the direction parallel to the Y direction. The opening of the inductor L3 is a region surrounded by the first through hole line L3a, the second through hole line L3b, and the conductor layer 676.

Next, the inductors L1 and L4 will be described. The inductor L1 is arranged at a position between the inductor L2 and the side surface 50C (see FIG. 2 and FIG. 8). The inductor L4 is arranged at a position between the inductor L3 and the side surface 50D (see FIG. 2 and FIG. 8). As shown in FIG. 10, the inductor L1 is wound around an axis A1. The inductor L4 is wound around an axis A4. In the present embodiment in particular, each of the axes A1 and A4 extends in a direction parallel to the stacking direction T.

The inductor L1 corresponds to a "third inductor" in the present invention. The inductor L4 corresponds to a "fourth inductor" in the present invention.

The opening of the inductor L1 is a region surrounded by the conductor layer 571. The opening of the inductor L1 does not overlap the opening of the inductor L2 when seen in a direction parallel to the axis A1, in other words, the Z direction. Accordingly, in the present embodiment, magnetic coupling between the inductors L1 and L2 is weaker than when the opening of the inductor L1 faces the opening of the inductor L2.

The opening of the inductor L4 is a region surrounded by the conductor layer 572. The opening of the inductor L4 does not overlap the opening of the inductor L3 when seen in a direction parallel to the axis A4, in other words, the Z direction. Accordingly, in the present embodiment, magnetic coupling between the inductors L3 and L4 is weaker than when the opening of the inductor L4 faces the opening of the inductor L3.

Next, the input inductors L11 and L12 will be described. Each of the input inductors L11 and L12 is arranged at a position between the inductor L2 and the side surface 50C and between the inductor L1 and the top surface 50B (see FIG. 2 and FIG. 8). The input inductor L11 is arranged at a position closer to the side surface 50E than to the side surface 50F. The input inductor L12 is arranged at a position closer to the side surface 50F than to the side surface 50E.

As shown in FIG. 11, each of the input inductors L11 and L12 is wound around an axis in a direction different from a direction of the axis A2 shown in FIG. 9. Accordingly, in the present embodiment, magnetic coupling between the input inductor L11 and the inductor L2 is weaker than when the input inductor L11 is wound around an axis in the same direction as that of the axis A2 (direction parallel to the X direction) and the opening of the input inductor L11 faces the opening of the inductor L2. Similarly, magnetic coupling between the input inductor L12 and the inductor L2 is weaker than when the input inductor L12 is wound around an axis in the same direction as that of the axis A2 (direction parallel to the X direction) and the opening of the input inductor L12 faces the opening of the inductor L2.

Each of the input inductors L11 and L12 is wound around an axis in a direction different from a direction of the axis A1 shown in FIG. 10. Accordingly, in the present embodiment, magnetic coupling between the input inductor L11 and the inductor L1 is weaker than when the input inductor L11 is wound around an axis in the same direction as that of the axis A1 (direction parallel to the stacking direction T) and the opening of the input inductor L11 faces the opening of the inductor L1. Similarly, magnetic coupling between the input inductor L12 and the inductor L1 is weaker than when the input inductor L12 is wound around an axis in the same direction as that of the axis A1 (direction parallel to the stacking direction T) and the opening of the input inductor L12 faces the opening of the inductor L1.

The input inductors L11 and L12 are wound around the axes extending in directions different from each other. Accordingly, in the present embodiment, magnetic coupling between the input inductors L11 and L12 is weaker than when the input inductors L11 and L12 are wound around axes extending in the same direction and the opening of the input inductor L11 and the opening of the input inductor L12 face each other. In the present embodiment in particular, the input inductor L11 is wound around an axis A11 extending in a direction parallel to a direction inclined from the X direction toward the −Y direction. The input inductor L12 is wound around an axis A12 extending in a direction parallel to a direction inclined from the X direction toward the Y direction. Each of the axes A11 and A12 extends in a direction orthogonal to the stacking direction T.

The input inductor L11 includes a first through hole line L11a, a second through hole line L11b, and the conductor layers 671 and 681 connecting the first through hole line L11a and the second through hole line L11b. The first through hole line L11a is formed with the plurality of through holes kT5 being connected in series. The second through hole line L11b is formed with the plurality of through holes mT9 being connected in series. Note that, as described above, k is an integer from 58 to 60, or 67, and m is 59, 60, or 67.

Each of the conductor layers 671 and 681 extends in a first direction parallel to a direction inclined from the X direction toward the Y direction. The first through hole line L11a and the second through hole line L11b are arrayed in the first direction. The opening of the input inductor L11 is a region surrounded by the first through hole line Lila, the second through hole line L11b, and the conductor layer 671.

The input inductor L12 includes a first through hole line L12a, a second through hole line L12b, and the conductor layers 672 and 682 connecting the first through hole line L12a and the second through hole line L12b. The first through hole line L12a is formed with the plurality of through holes kT6 being connected in series. The second through hole line L12b is formed with the plurality of through holes mT10 being connected in series.

Each of the conductor layers 672 and 682 extends in a second direction parallel to a direction inclined from the X direction toward the −Y direction. The first through hole line L12a and the second through hole line L12b are arrayed in the second direction. The opening of the input inductor L12 is a region surrounded by the first through hole line L12a, the second through hole line L12b, and the conductor layer 671.

Next, the output inductors L21 and L22 will be described. Each of the output inductors L21 and L22 are arranged at a position between the inductor L3 and the side surface 50D and between the inductor L4 and the top surface 50B (see FIG. 2 and FIG. 8). The output inductor L21 is arranged at a position closer to the side surface 50E than to the side surface 50F. The output inductor L22 is arranged at a position closer to the side surface 50F than to the side surface 50E.

As shown in FIG. 11, each of the output inductors L21 and L22 is wound around an axis in a direction different from a direction of the axis A3 shown in FIG. 9. Accordingly, in the present embodiment, magnetic coupling between the output inductor L21 and the inductor L3 is weaker than when the output inductor L21 is wound around an axis in the same direction as that of the axis A3 (direction parallel to the X direction) and the opening of the output inductor L21 faces the opening of the inductor L3. Similarly, magnetic coupling between the output inductor L22 and the inductor L3 is weaker than when the output inductor L22 is wound around an axis in the same direction as that of the axis A3 (direction parallel to the X direction) and the opening of the output inductor L22 faces the opening of the inductor L3.

Each of the output inductors L21 and L22 is wound around an axis in a direction different from a direction of the axis A4 shown in FIG. 10. Accordingly, in the present embodiment, magnetic coupling between the output inductor L21 and the inductor L4 is weaker than when the output inductor L21 is wound around an axis in the same direction as that of the axis A4 (direction parallel to the stacking direction T) and the opening of the output inductor L21 faces the opening of the inductor L4. Similarly, magnetic coupling between the output inductor L22 and the inductor L4 is weaker than when the output inductor L22 is wound around an axis in the same direction as that of the axis A4 (direction parallel to the stacking direction T) and the opening of the output inductor L22 faces the opening of the inductor L4.

The output inductors L21 and L22 are wound around axes extending in directions different from each other. Accordingly, in the present embodiment, magnetic coupling between the output inductors L21 and L22 is weaker than when the output inductors L21 and L22 are wound around axes extending in the same direction and the opening of the output inductor L21 and the opening of the output inductor L22 face each other. In the present embodiment in particular, the output inductor L21 is wound around an axis A21 extending in a direction parallel to a direction inclined from the −X direction toward the −Y direction. The output inductor L22 is wound around an axis A22 extending in a direction parallel to a direction inclined from the −X direction toward the Y direction. Each of the axes A21 and A22 extends in a direction orthogonal to the stacking direction T.

The output inductor L21 includes a first through hole line L21a, a second through hole line L21b, and the conductor layers 673 and 683 connecting the first through hole line L21a and the second through hole line L21b. The first through hole line L21a is formed with the plurality of through holes kT7 being connected in series. The second through hole line L21b is formed with the plurality of through holes mT11 being connected in series.

Each of the conductor layers 673 and 683 extends in a third direction parallel to a direction inclined from the −X direction toward the Y direction. The first through hole line L21a and the second through hole line L21b are arrayed in the third direction. The opening of the output inductor L21 is a region surrounded by the first through hole line L21a, the second through hole line L21b, and the conductor layer 673.

The output inductor L22 includes a first through hole line L22a, a second through hole line L22b, and the conductor layers 674 and 684 connecting the first through hole line L22a and the second through hole line L22b. The first through hole line L22a is formed with the plurality of through holes kT8 being connected in series. The second through hole line L22b is formed with the plurality of through holes mT12 being connected in series.

Each of the conductor layers 674 and 684 extends in a fourth direction parallel to a direction inclined from the −X direction toward the −Y direction. The first through hole line L22a and the second through hole line L22b are arrayed in the fourth direction. The opening of the output inductor L22 is a region surrounded by the first through hole line L22a, the second through hole line L22b, and the conductor layer 674.

Figure 12:
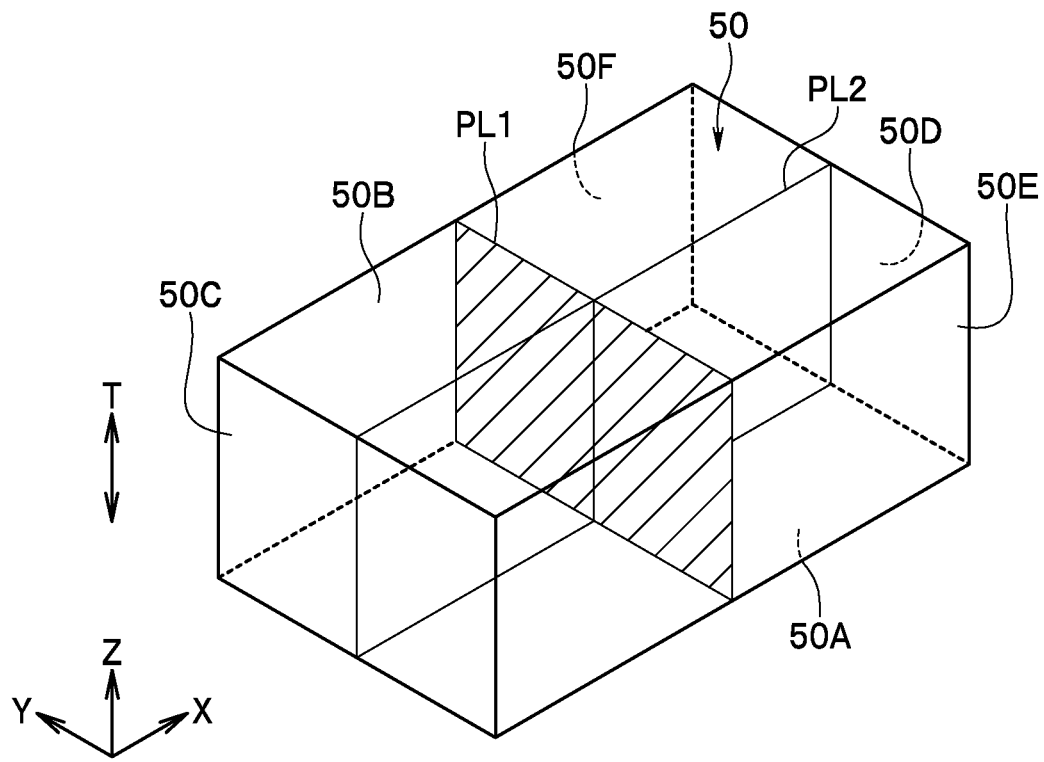
FIG. 12 is an explanatory diagram for describing first and second imaginary planes according to the embodiment of the present invention.

Here, a first imaginary plane PL1 passing between the inductor L2 and the inductor L3 and being parallel to the stacking direction T of the plurality of dielectric layers and a second imaginary plane PL2 crossing the inductors L2 and L3 and being parallel to the stacking direction T of the plurality of dielectric layers are assumed. FIG. 12 is an explanatory diagram for describing the first and second imaginary planes PL1 and PL2. Note that, in FIG. 12, for the sake of better understanding, the first imaginary plane PL1 is hatched.

In the present embodiment in particular, the first imaginary plane PL1 is a YZ plane perpendicular to each of the bottom surface 50A and the top surface 50B. The first imaginary plane PL1 crosses the stack 50 at the center of the stack 50 in the long-side direction (direction parallel to the X direction) of the bottom surface 50A or the top surface 50B.

In the present embodiment in particular, the second imaginary plane PL2 is an XZ plane perpendicular to each of the bottom surface 50A and the top surface 50B. The second imaginary plane PL2 crosses the stack 50 at the center of the stack 50 in the short-side direction (direction parallel to the Y direction) of the bottom surface 50A or the top surface 50B.

In the stack 50 except the dielectric layers 69 to 77, a plurality of conductors (a plurality of conductor layers and a plurality of through holes) constituting a part including the pair of balanced input terminals 111 and 116, the resonator 10 (inductor L1), the resonator 20 (inductor L2), the input inductors L11 and L12, and the capacitors C1, C2, C11, C12, C21, and C22 are referred to as a plurality of first conductors. In the stack 50 except the dielectric layers 69 to 77, a plurality of conductors (a plurality of conductor layers and a plurality of through holes) constituting a part including the pair of balanced output terminals 113 and 114, the resonator 30 (inductor L3), the resonator 40 (inductor L4), the output inductors L21 and L22, and the capacitors C3, C4, C31, C32, C41, and C42 are referred to as a plurality of second conductors. The shape and the arrangement of the plurality of first conductors are symmetrical with the shape and the arrangement of the plurality of second conductors, with respect to the first imaginary plane PL1.

In the present embodiment in particular, the shapes and the arrangements of the plurality of conductors in each of a pair of the inductors L1 and L4 and a pair of the inductors L2 and L3 are symmetrical with respect to the first imaginary plane PL1. The shapes and the arrangements of the plurality of conductors in each of a pair of the input inductor L11 and the output inductor L21 and a pair of the input inductor L12 and the output inductor L22 are symmetrical with respect to the first imaginary plane PL1. The shapes and the arrangements of the plurality of conductors in each of a pair of the capacitors C1 and C3, a pair of the capacitors C2 and C4, a pair of the capacitors C11 and C41, a pair of the capacitors C12 and C42, a pair of the capacitors C21 and C31, and a pair of the capacitors C22 and C32 are symmetrical with respect to the first imaginary plane PL1. The capacitors C5 and C6 have a symmetrical shape with respect to the first imaginary plane PL1.

In the stack 50 except the dielectric layers 69 to 77, a plurality of conductors (a plurality of conductor layers and a plurality of through holes) constituting a part including the balanced input terminal 111, the balanced output terminal 113, the input inductor L11, the output inductor L21, and the capacitors C1, C3, C5, C11, C21, C31, and C41 are referred to as a plurality of third conductors. In the stack 50 except the dielectric layers 69 to 77, a plurality of conductors (a plurality of conductor layers and a plurality of through holes) constituting a part including the balanced input terminal 116, the balanced output terminal 114, the input inductor L12, the output inductor L22, and the capacitors C2, C4, C6, C12, C22, C32, and C42 are referred to as a plurality of fourth conductors. The shape and the arrangement of the plurality of third conductors are symmetrical with the shape and the arrangement of the plurality of fourth conductors, with respect to the second imaginary plane PL2.

In the present embodiment in particular, the shapes and the arrangements of the plurality of conductors in each of a pair of the input inductors L11 and L12 and a pair of the output inductors L21 and L22 are symmetrical with respect to the second imaginary plane PL2. The shapes and the arrangements of the plurality of conductors in each of a pair of the capacitors C1 and C2, a pair of the capacitors C3 and C4, a pair of the capacitors C5 and C6, a pair of the capacitors C11 and C12, a pair of the capacitors C21 and C22, a pair of the capacitors C31 and C32, and a pair of the capacitors C41 and C42 are symmetrical with respect to the second imaginary plane PL2. The inductors L1 to L4 have a symmetrical shape with respect to the second imaginary plane PL2.

Next, working and effects of the filter circuit 1 according to the present embodiment and the filter device 2 according to the present embodiment will be described. The filter circuit 1 according to the present embodiment is a balanced band-pass filter. Thus, if the resonator 20 and the resonator 30 are to be coupled to each other with inductors, two inductors are needed. In contrast, in the present embodiment, the resonator 20 and the resonator 30 are magnetically coupled to each other without using inductors. With this, according to the present embodiment, the filter circuit 1 can be downsized.

Through a comparison with the same wavelength, in general, two capacitors connected to both ends of a half-resonator have an effect of reducing the length of the half-resonator. In the present embodiment, the two capacitors C21 and C31 are provided in the path 3 connecting one end of the resonator 20 and one end of the resonator 30, and the two capacitors C22 and C32 are provided in the path 4 connecting the other end of the resonator 20 and the other end of the resonator 30. With this, according to the present embodiment, the length of each of the resonators 20 and 30 can be reduced, and as a result, the filter circuit 1 can be downsized.

In the filter device 2 according to the present embodiment, the opening of the inductor L2 of the resonator 20 and the opening of the inductor L3 of the resonator 30 face each other. With this, according to the present embodiment, the magnetic coupling between the resonator 20 (inductor L2) and the resonator 30 (inductor L3) can be strengthened without using inductors. In other words, according to the present embodiment, no inductors need to be provided between the inductor L2 and the inductor L3, and therefore the filter device 2 can be downsized.

In the present embodiment, the opening of the inductor L1 of the resonator 10 close to the pair of balanced input terminals 111 and 116 in the circuit configuration does not face the opening of the inductor L4 of the resonator 40 close to the pair of balanced output terminals 113 and 114 in the circuit configuration. With this, according to the present embodiment, the magnetic coupling between the inductors L1 and L4 can be weakened, and as a result, capacitance of each of the capacitors C1 to C4 can be reduced. With this, according to the present embodiment, the number of the plurality of conductor layers constituting the capacitors C1 to C4 can be reduced, and the plurality of conductor layers can be downsized. With this, according to the present embodiment, the filter device 2 can be downsized.

Next, other effects of the present embodiment will be described. As described above, in the present embodiment, the magnetic coupling between the inductors L1 and L4 can be weakened. With this, according to the present embodiment, in a frequency band lower than a passband of the filter circuit 1 (filter device 2), an absolute value of pass attenuation can be increased.

In the present embodiment, the opening of the inductor L1 does not overlap the opening of the inductor L2, and the opening of the inductor L4 does not overlap the opening of the inductor L3. With this, according to the present embodiment, obstruction in the magnetic coupling between the inductors L2 and L3 and weakening of the magnetic coupling between the inductors L2 and L3 due to the inductors L1 and L4 can be prevented.

Figure 13:
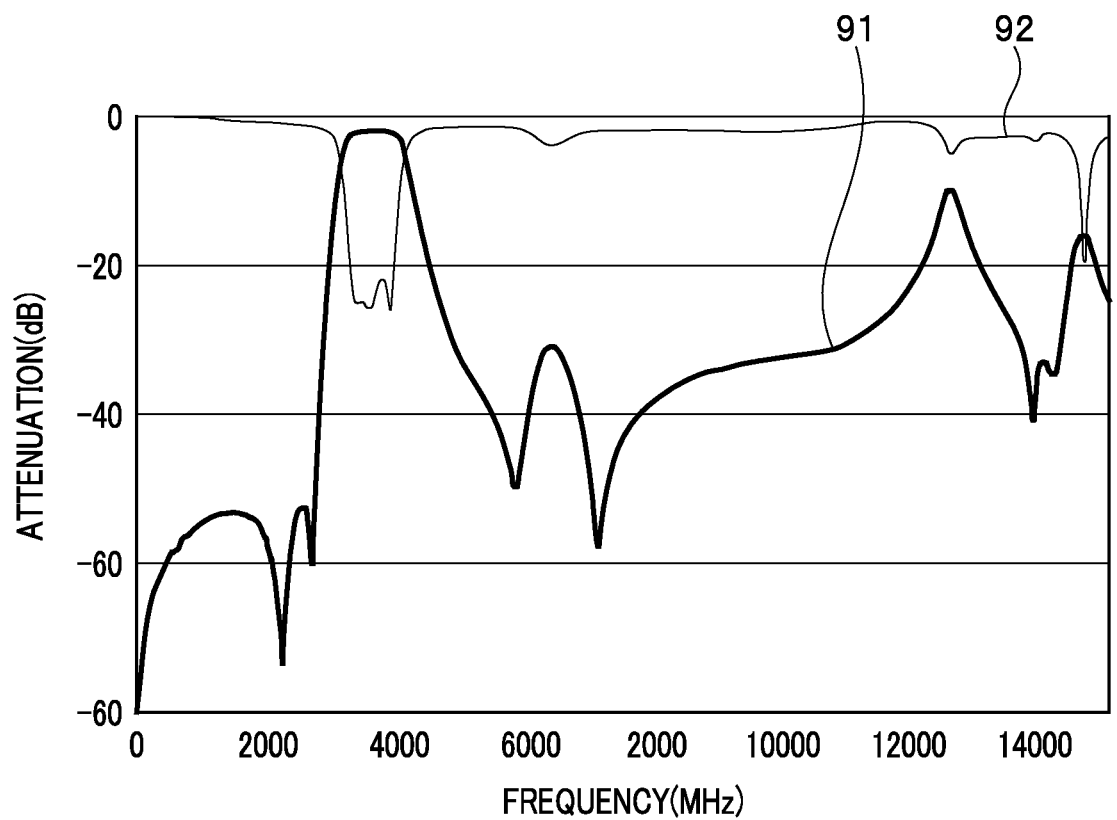
FIG. 13 is a characteristic chart showing an example of pass attenuation characteristics and return attenuation characteristics of the multilayered filter device according to the embodiment of the present invention.

Next, an example of characteristics of the filter device 2 according to the present embodiment will be described. Here, an example of characteristics of the filter device 2 when the passband of the filter device 2 is designed to include a frequency band of 3.3 GHz to 3.9 GHz will be described. FIG. 13 is a characteristic chart showing an example of pass attenuation characteristics and return attenuation characteristics of the filter device 2. In FIG. 13, the horizontal axis represents frequency, and the vertical axis represents attenuation. In FIG. 13, a curve denoted by a reference numeral 91 represents the pass attenuation characteristics of the filter device 2. A curve denoted by a reference numeral 93 represents the return attenuation characteristics in the pair of balanced input terminals 111 and 116.

Figure 14:
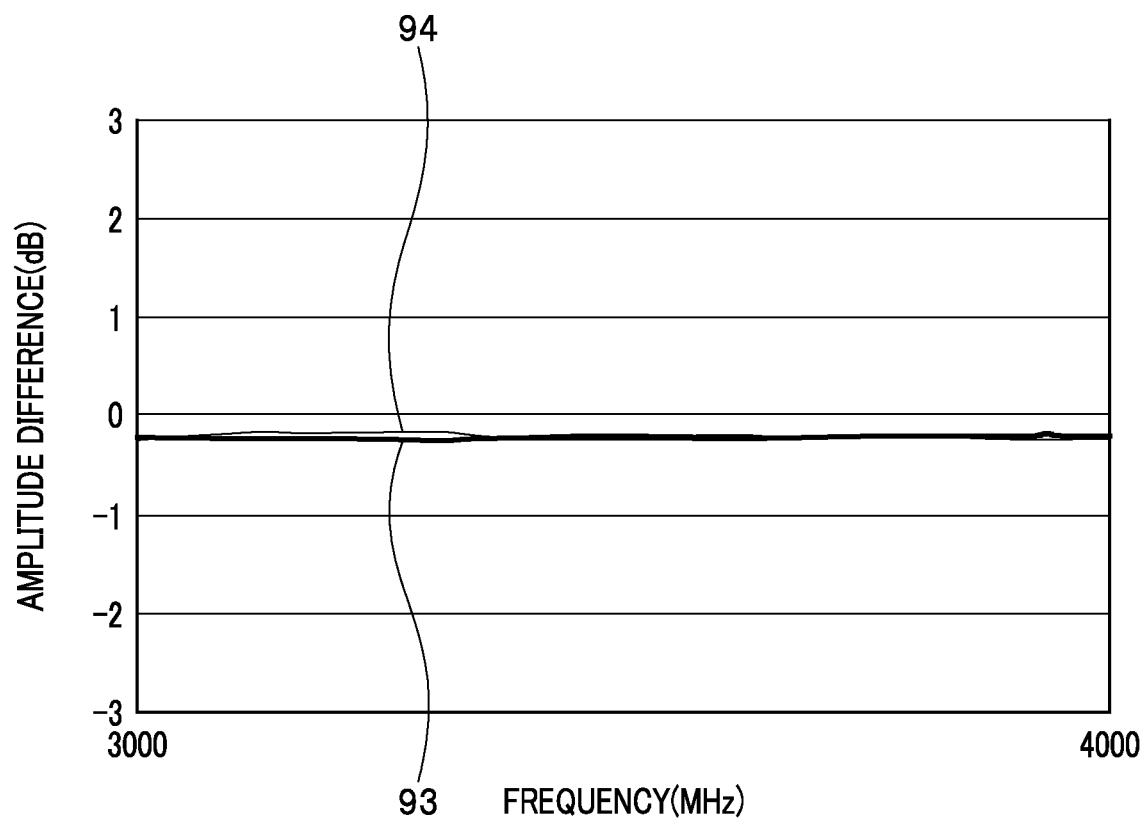
FIG. 14 is a characteristic chart showing an example of amplitude balance characteristics of the multilayered filter device according to the embodiment of the present invention.

FIG. 14 shows an example of amplitude balance characteristics of the filter device 2. Here, the amplitude balance characteristics of the filter device 2 are shown using a difference of amplitudes of two balanced element signals output from the terminals 113 and 114 when balanced signals are input to the terminals 111 and 116 and a difference of amplitudes of two balanced element signals output from the terminals 111 and 116 when balanced signals are input to the terminals 113 and 114. The difference of amplitudes of two balanced element signals is hereinafter referred to as an amplitude difference. The amplitude difference when balanced signals are input to the terminals 111 and 116 is shown using a positive value on the condition that the amplitude of the balanced element signal output from the terminal 113 is larger than the amplitude of the balanced element signal output from the terminal 114, and in a case opposite to the above, the amplitude difference is shown using a negative value. Similarly, the amplitude difference when balanced signals are input to the terminals 113 and 114 is shown using a positive value on the condition that the amplitude of the balanced element signal output from the terminal 111 is larger than the amplitude of the balanced element signal output from the terminal 116, and in a case opposite to the above, the amplitude difference is shown using a negative value.

In FIG. 14, the horizontal axis represents frequency, and the vertical axis represents amplitude difference. In FIG. 14, the reference numeral 93 represents the amplitude difference when balanced signals are input to the terminals 111 and 116, and the reference numeral 94 represents the amplitude difference when balanced signals are input to the terminals 113 and 114. With the amplitude difference being represented by m (dB), a value of m is preferably −1.0 or more and not more than 1.0. As shown in FIG. 14, the filter device 2 has an m value of −1.0 or more and not more than 1.0 in the foregoing frequency band.

Figure 15:
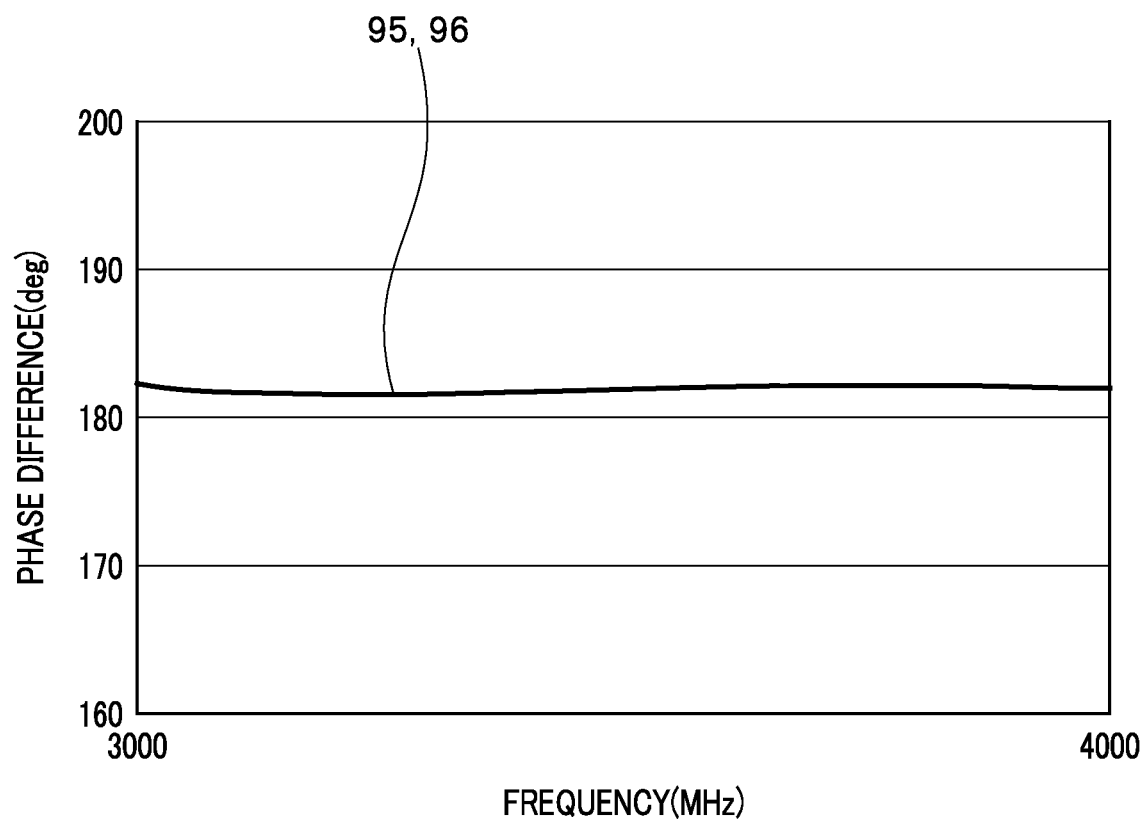
FIG. 15 is a characteristic chart showing an example of phase balance characteristics of the multilayered filter device according to the embodiment of the present invention.

FIG. 15 shows an example of phase balance characteristics of the filter device 2. Here, the phase balance characteristics of the filter device 2 are shown using a difference of phases of two balanced element signals output from the terminals 113 and 114 when balanced signals are input to the terminals 111 and 116 and a difference of phases of two balanced element signals output from the terminals 111 and 116 when balanced signals are input to the terminals 113 and 114. The difference of phases of two balanced element signals is hereinafter referred to as a phase difference. The phase difference when balanced signals are input to the terminals 111 and 116 represents a degree of advance of the balanced element signal output from the terminal 113 with respect to the phase of the balanced element signal output from the terminal 114. Similarly, the phase difference when balanced signals are input to the terminals 113 and 114 represents a degree of advance of the balanced element signal output from the terminal 111 with respect to the phase of the balanced element signal output from the terminal 116.

In FIG. 15, the horizontal axis represents frequency, and the vertical axis represents phase difference. In FIG. 15, the reference numeral 95 represents the phase difference when balanced signals are input to the terminals 111 and 116, and the reference numeral 96 represents the phase difference when balanced signals are input to the terminals 113 and 114. Note that, in FIG. 15, the phase difference represented by the reference numeral 95 and the phase difference represented by the reference numeral 96 mostly overlap. With the amplitude difference being represented by p (deg), a value of p is preferably 170 or more and not more than 190. As shown in FIG. 15, the filter device 2 has a p value of 170 or more and not more than 190 in the foregoing frequency band.

Based on FIG. 14 and FIG. 15, it can be understood that the filter device 2 functions as a balanced band-pass filter also when the pair of balanced output terminals 113 and 114 is used as a pair of balanced input terminals.

Note that the present invention is not limited to the foregoing embodiment, and various modifications can be made thereto. For example, the resonators 10 and 40 need not be provided. Alternatively, in addition to the resonators 10, 20, 30, and 40, a plurality of resonators may be provided. At least one of the pair of the input inductors L11 and L12 and the pair of the output inductors L21 and L22 need not be provided.

The inductors L2 and L3, the input inductors L11 and L12, and the output inductors L21 and L22 may each be formed of inductor conductor layers wound around an axis parallel to the stacking direction T. The inductors L1 and L4 may each be formed of two through hole lines and conductor layer(s) connecting the two through hole lines.

The filter circuit of the present invention may be a balanced filter, other than a band-pass filter, which includes two resonators corresponding to the resonators 20 and 30. In the filter, between the two resonators, capacitors are present but no inductors are present in the circuit configuration. Similarly, the filter device of the present invention may be a balanced filter device, other than a band-pass filter, which includes two inductors corresponding to the inductors L2 and L3. In the filter device, openings of the two inductors face each other.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. A filter circuit comprising:
a pair of balanced input ports;
a pair of balanced output ports;
a first resonator and a second resonator provided in parallel between the pair of balanced input ports and the pair of balanced output ports in a circuit configuration, the first resonator and the second resonator being magnetically coupled to each other; and a third resonator provided in parallel to the first resonator, between the pair of balanced input ports and the first resonator in the circuit configuration,
wherein
between the first resonator and the second resonator, a capacitor is present but no inductor is present in the circuit configuration.

2. The filter circuit according to claim 1, further comprising:
a first capacitor provided in a path connecting one end of the first resonator and one end of the second resonator; and
a second capacitor provided in a path connecting another end of the first resonator and another end of the second resonator.

3. The filter circuit according to claim 1, further comprising
a fourth resonator provided in parallel to the second resonator, between the pair of balanced output ports and the second resonator in the circuit configuration.

4. The filter circuit according to claim 1, further comprising
two input inductors electrically connected to the pair of balanced input ports.

5. The filter circuit according to claim 1, further comprising
two output inductors electrically connected to the pair of balanced output ports.

6. The filter circuit according to claim 1, wherein
the filter circuit has the circuit configuration in which a part including the pair of balanced input ports and the first resonator in the circuit configuration and a part including the pair of balanced output ports and the second resonator in the circuit configuration are configured to be symmetrical with respect to a center between the first resonator and the second resonator.

7. The filter circuit according to claim 1, wherein
the filter circuit has the circuit configuration in which a part including one port of the pair of balanced input ports and one port of the pair of balanced output ports in the circuit configuration and a part including another port of the pair of balanced input ports and another port of the pair of balanced output ports in the circuit configuration are configured to be symmetrical with respect to the first resonator and the second resonator.

8. A multilayered filter device comprising:
a pair of balanced input terminals;
a pair of balanced output terminals;
a first resonator and a second resonator provided in parallel between the pair of balanced input terminals and the pair of balanced output terminals in a circuit configuration, the first resonator and the second resonator being magnetically coupled to each other;
a third resonator provided in parallel to the first resonator between the pair of balanced input terminals and the first resonator in the circuit configuration; and
a stack for integrating the pair of balanced input terminals, the pair of balanced output terminals, the first resonator, the second resonator, and the third resonator, the stack including a plurality of dielectric layers stacked together, wherein
the first resonator includes a first inductor wound around a first axis,
the second resonator includes a second inductor wound around a second axis, and
an opening of the first inductor and an opening of the second inductor face each other.

9. The multilayered filter device according to claim 8, wherein
each of the first inductor and the second inductor includes a first through hole line, a second through hole line, and a conductor layer connecting the first through hole line and the second through hole line, and
each of the first through hole line and the second through hole line is formed with two or more through holes being connected in series.

10. The multilayered filter device according to claim 8, wherein the third resonator includes a third inductor wound around a third axis, and
an opening of the third inductor does not overlap the opening of the first inductor when seen in a direction parallel to the third axis.

11. The multilayered filter device according to claim 8, further comprising
a fourth resonator provided in parallel to the second resonator, between the pair of balanced output terminals and the second resonator in the circuit configuration.

12. The multilayered filter device according to claim 11, wherein
the fourth resonator includes a fourth inductor wound around a fourth axis, and
an opening of the fourth inductor does not overlap the opening of the second inductor when seen in a direction parallel to the fourth axis.

13. The multilayered filter device according to claim 8, further comprising two input inductors electrically connected to the pair of balanced input terminals.

14. The multilayered filter device according to claim 13, wherein
each of the two input inductors is wound around an axis extending in a direction different from a direction of the first axis.

15. The multilayered filter device according to claim 13, wherein
the two input inductors are wound around axes extending in directions different from each other.

16. The multilayered filter device according to claim 8, further comprising two output inductors electrically connected to the pair of balanced output terminals.

17. The multilayered filter device according to claim 16, wherein
each of the two output inductors is wound around an axis extending in a direction different from a direction of the second axis.

18. The multilayered filter device according to claim 16, wherein
the two output inductors are wound around axes extending in directions different from each other.

19. The multilayered filter device according to claim 8, wherein
a shape and an arrangement of a plurality of conductors constituting a part including the pair of balanced input terminals and the first resonator in the stack are symmetrical with a shape and an arrangement of a plurality of conductors constituting a part including the pair of balanced output terminals and the second resonator in the stack, with respect to a first imaginary plane passing between the first inductor and the second inductor and being parallel to a stacking direction of the plurality of dielectric layers.

20. The multilayered filter device according to claim 8, wherein a shape and an arrangement of a plurality of conductors constituting a part including one terminal of the pair of balanced input terminals and one terminal of the pair of balanced output terminals in the stack are symmetrical with a shape and an arrangement of a plurality of conductors constituting a part including another terminal of the pair of balanced input terminals and another terminal of the pair of balanced output terminals in the stack, with respect to a second imaginary plane crossing the first inductor and the second inductor and being parallel to a stacking direction of the plurality of dielectric layers.

* * * * *